US012702024B2

(12) United States Patent
Na et al.

(10) Patent No.: US 12,702,024 B2
(45) Date of Patent: Aug. 4, 2026

(54) CIRCUIT BOARD

(71) Applicant: LG INNOTEK CO., LTD., Seoul (KR)

(72) Inventors: Se Woong Na, Seoul (KR); Sang Il Kim, Seoul (KR); Kee Han Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 189 days.

(21) Appl. No.: 18/692,449

(22) PCT Filed: Sep. 14, 2022

(86) PCT No.: PCT/KR2022/013692
§ 371 (c)(1),
(2) Date: Mar. 15, 2024

(87) PCT Pub. No.: WO2023/043172

PCT Pub. Date: Mar. 23, 2023

(65) Prior Publication Data

US 2025/0125269 A1    Apr. 17, 2025

(30) Foreign Application Priority Data

Sep. 16, 2021    (KR) ........................ 10-2021-0124374

(51) Int. Cl.
*H10W 70/60* (2026.01)
*H05K 1/02* (2006.01)
(Continued)

(52) U.S. Cl.
CPC ........ *H10W 70/611* (2026.01); *H05K 1/0298* (2013.01); *H05K 1/113* (2013.01);
(Continued)

(58) Field of Classification Search
None
See application file for complete search history.

(56) References Cited

U.S. PATENT DOCUMENTS 7,205,483 B2 * 4/2007 Yamashita ........... H05K 3/4084
174/262
7,649,748 B2 1/2010 Kariya et al.
(Continued)

FOREIGN PATENT DOCUMENTS

CN        102612263 A  *  7/2012  ............ H10W 78/00
CN        104733371        6/2015
(Continued)

OTHER PUBLICATIONS

International Search Report dated Dec. 22, 2022 issued in Application No. PCT/KR2022/013692.
(Continued)

*Primary Examiner* — Krystal Robinson
(74) *Attorney, Agent, or Firm* — KED & ASSOCIATES

(57) ABSTRACT

A circuit board including a first insulating layer; a first circuit pattern layer disposed on the first insulating layer and including a first pad; a second circuit pattern layer disposed on a lower surface of the first insulating layer; and a first electrode part disposed in the first insulating layer and vertically overlapping the first pad. A lower surface of the first electrode part is located higher than an upper surface of the second circuit pattern layer, and the first pad includes a first concave portion formed in a region that vertically overlaps the first electrode part.

18 Claims, 12 Drawing Sheets

(a)

(b)

(51) Int. Cl.
    *H05K 1/11*         (2006.01)
    *H05K 1/181*       (2026.01)
    *H10W 70/685*    (2026.01)

(52) U.S. Cl.
    CPC .......... *H05K 1/181* (2013.01); *H10W 70/685*
    (2026.01); *H05K 2201/0939* (2013.01); *H05K*
                           *2201/09509* (2013.01)

(56)               References Cited

U.S. PATENT DOCUMENTS

| | | | |
|---|---|---|---|
| 7,817,440 B2 | 10/2010 | Kariya et al. | |
| 8,766,450 B2* | 7/2014 | Lee ..................... | H10W 90/701 |
| | | | 257/E23.068 |
| 8,785,790 B2* | 7/2014 | Uzoh ..................... | H05K 1/115 |
| | | | 174/262 |
| 9,215,805 B2* | 12/2015 | Zanma ................... | H05K 1/185 |
| 10,418,314 B2 | 9/2019 | Lu | |
| 10,531,577 B1* | 1/2020 | Grober ................... | H05K 3/429 |
| 10,950,587 B2 | 3/2021 | Jeon et al. | |
| 11,758,656 B2* | 9/2023 | Cartier, Jr. ......... | H01R 13/6473 |
| | | | 174/263 |
| 11,765,820 B2* | 9/2023 | Lee ..................... | H05K 1/0296 |
| | | | 174/251 |
| 11,842,893 B2 | 12/2023 | Na et al. | |
| 12,068,172 B2* | 8/2024 | Ibrahim ................ | H10W 70/05 |
| 12,108,531 B2* | 10/2024 | Koo ........................ | H05K 1/115 |
| 12,211,781 B2 | 1/2025 | Na et al. | |
| 12,300,677 B2* | 5/2025 | Huang ................ | H10W 42/121 |
| 12,490,559 B2* | 12/2025 | Lin ..................... | H10H 20/857 |
| 2008/0257595 A1* | 10/2008 | Hu ....................... | H05K 3/4007 |
| | | | 29/846 |
| 2011/0079420 A1 | 4/2011 | Chang et al. | |
| 2012/0186863 A1* | 7/2012 | Inoue ..................... | H05K 1/111 |
| | | | 174/257 |
| 2014/0041923 A1* | 2/2014 | Hisada ................... | H05K 1/115 |
| | | | 174/266 |
| 2014/0054768 A1* | 2/2014 | Yoshida ................ | H10W 72/20 |
| | | | 257/737 |
| 2015/0034366 A1* | 2/2015 | Yoshioka .............. | H05K 1/119 |
| | | | 174/251 |
| 2015/0136475 A1* | 5/2015 | Boutaud .............. | A61N 1/3754 |
| | | | 29/846 |
| 2016/0100484 A1* | 4/2016 | Kunieda .............. | H05K 3/4007 |
| | | | 174/250 |
| 2016/0148854 A1* | 5/2016 | Hsu ........................ | H10W 40/00 |
| | | | 361/767 |
| 2016/0198568 A1* | 7/2016 | Park ..................... | H05K 3/4682 |
| | | | 174/262 |
| 2016/0330836 A1* | 11/2016 | Mizutani ................ | H05K 3/423 |
| 2021/0183784 A1* | 6/2021 | Hwang .............. | H10W 70/614 |
| 2021/0185822 A1* | 6/2021 | Lee ........................ | H05K 1/186 |
| 2023/0113302 A1* | 4/2023 | Jeon ..................... | H05K 3/285 |
| | | | 174/261 |
| 2023/0115650 A1* | 4/2023 | Iyoda ..................... | H05K 1/112 |
| | | | 174/261 |
| 2025/0125240 A1 | 4/2025 | Na et al. | |

FOREIGN PATENT DOCUMENTS

| | | |
|---|---|---|
| CN | 109755212 | 5/2019 |
| KR | 10-2008-0013000 | 2/2008 |
| KR | 10-2009-0053202 | 5/2009 |
| KR | 10-2011-0036149 | 4/2011 |
| KR | 10-2012-0085673 | 8/2012 |
| KR | 10-2016-0085120 | 7/2016 |
| KR | 10-2020-0051215 | 5/2020 |
| KR | 10-2021-0000105 | 1/2021 |
| KR | 10-2021-0080833 | 7/2021 |

OTHER PUBLICATIONS

Korean Office Action dated Jun. 26, 2025, issued in Application No. 10-2021-0124374.
Korean Office Action issued in Application No. 10-2021-0124374 dated Feb. 9, 2026.

\* cited by examiner

【FIG. 1A】
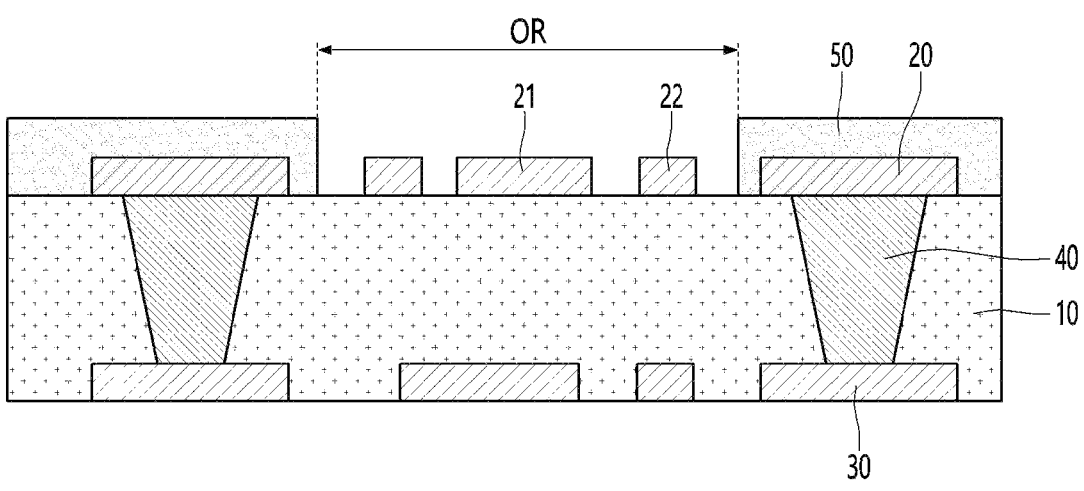

【FIG. 1B】
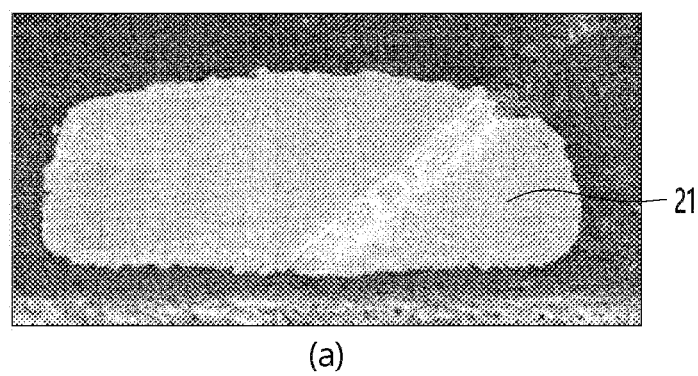
(a)
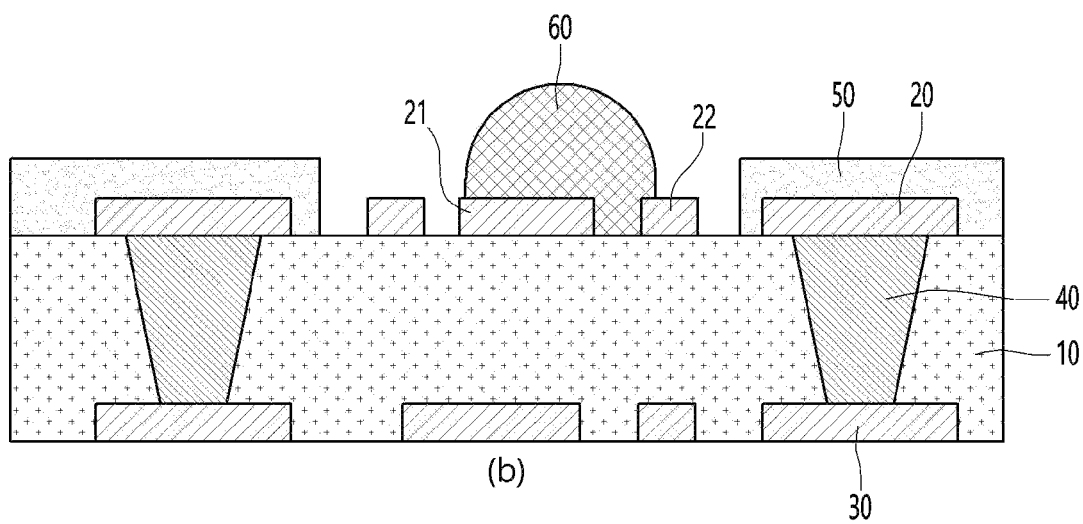
(b)

【FIG. 2】
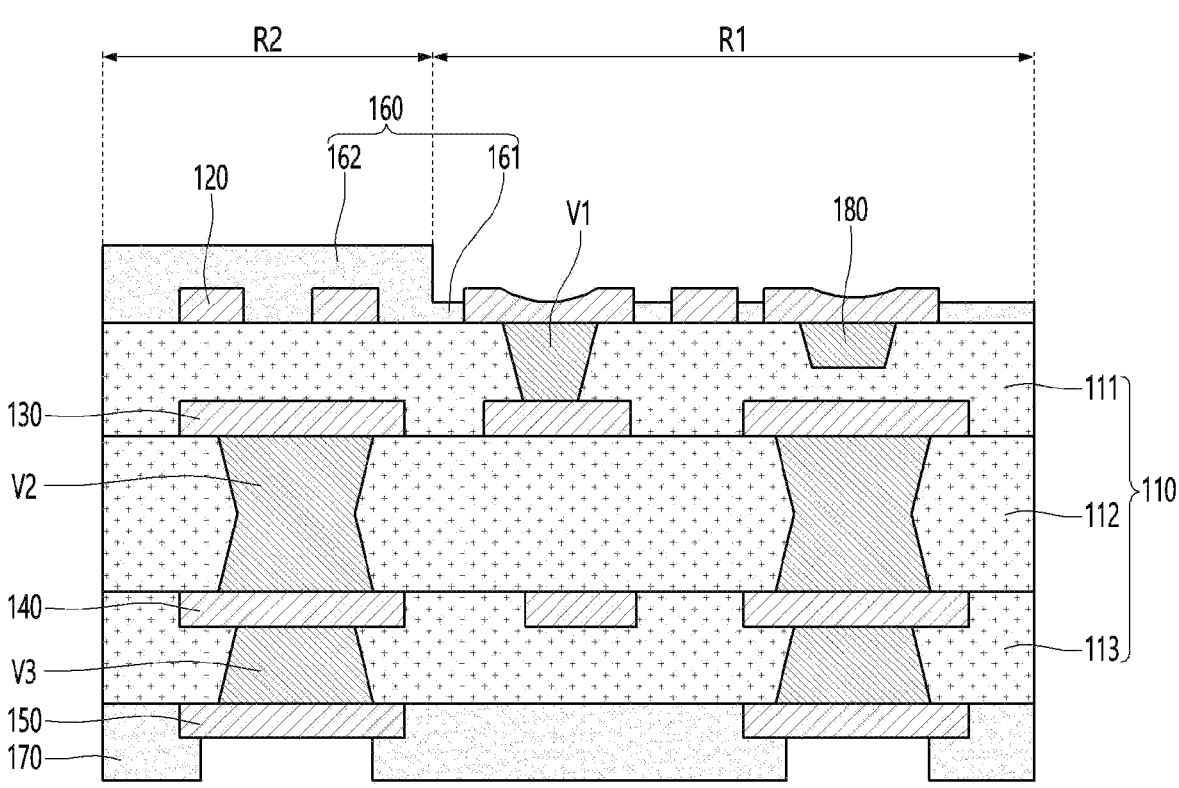

【FIG. 3A】
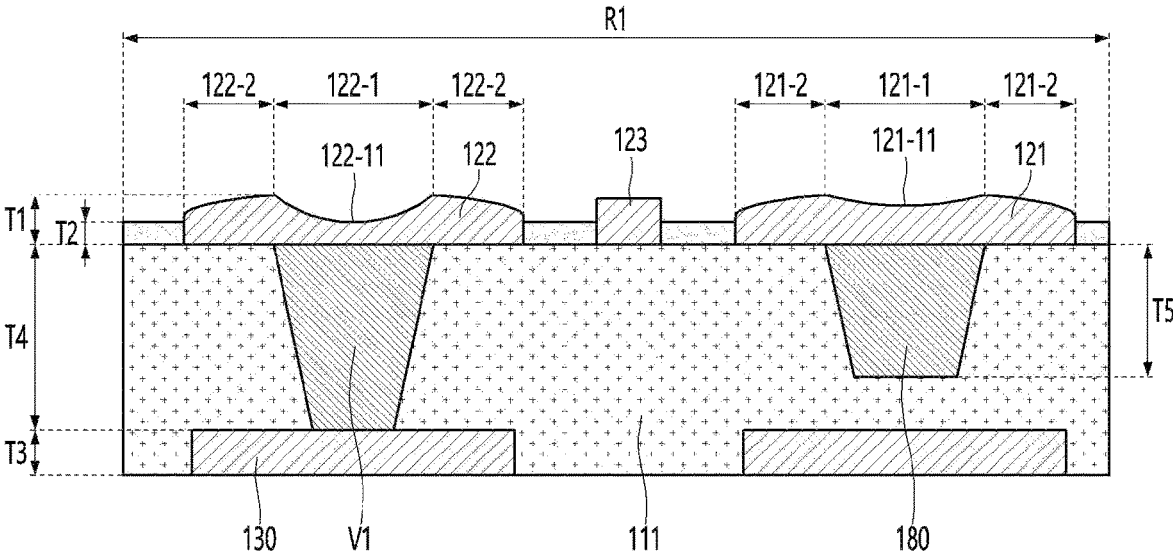
【FIG. 3B】
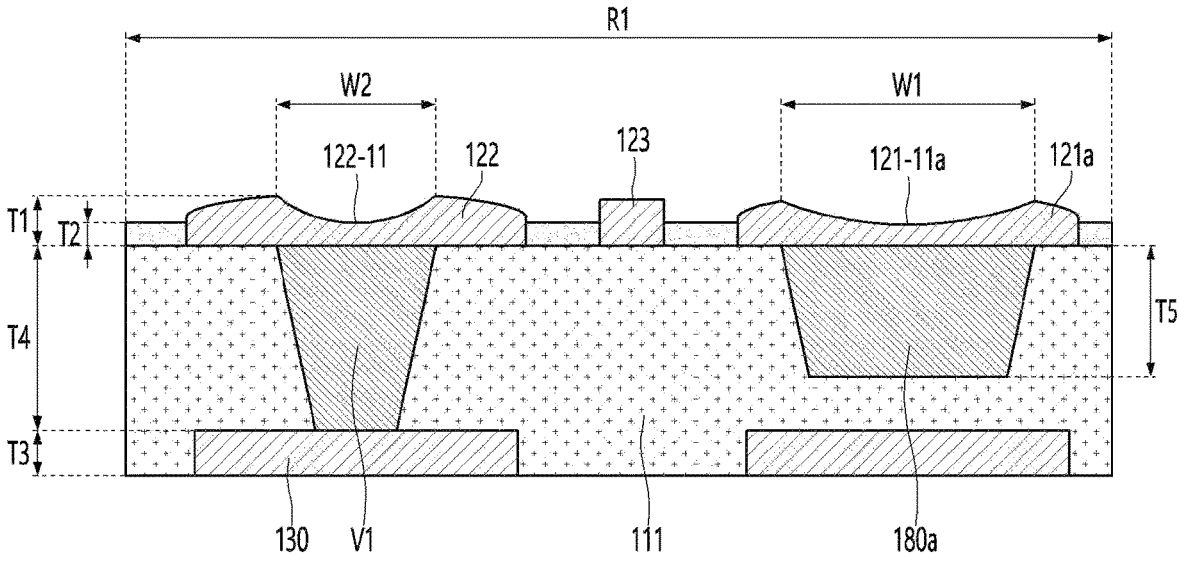

【FIG. 3C】
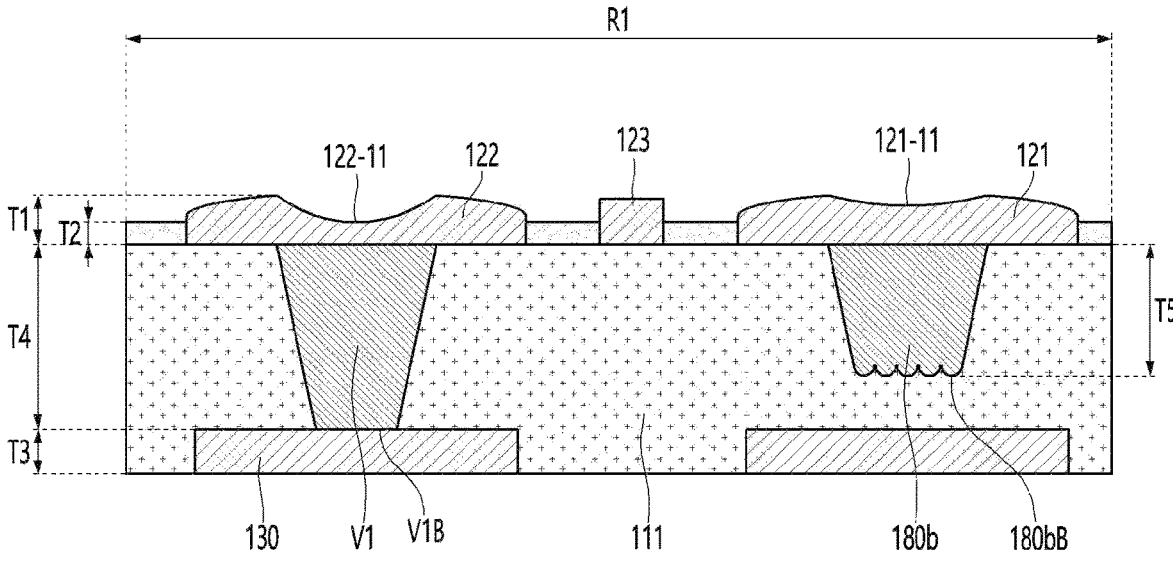
【FIG. 3D】
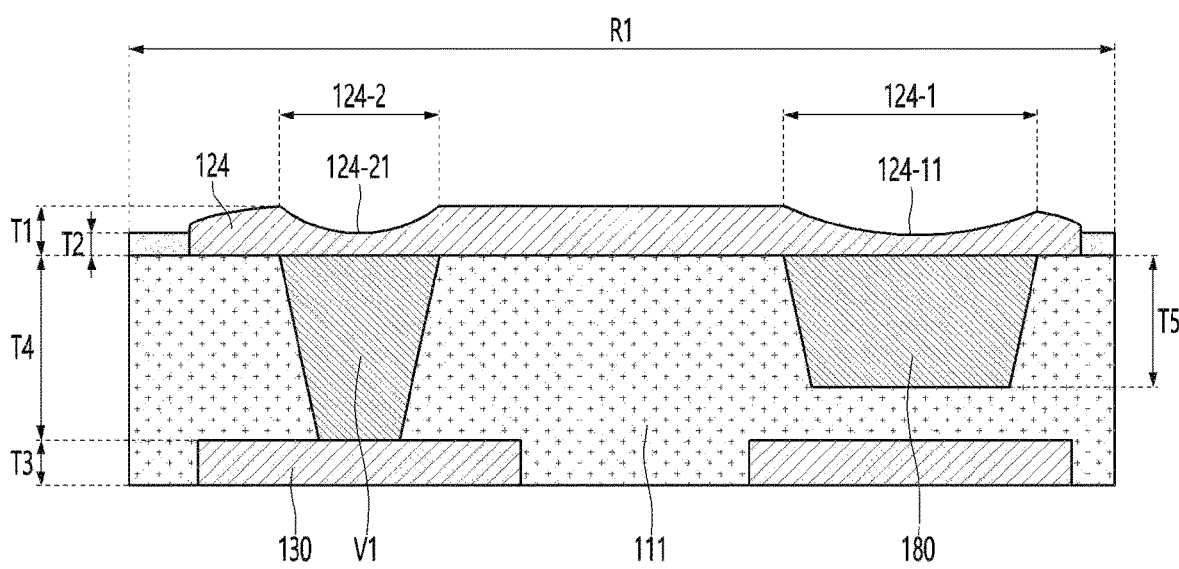

【FIG. 4】
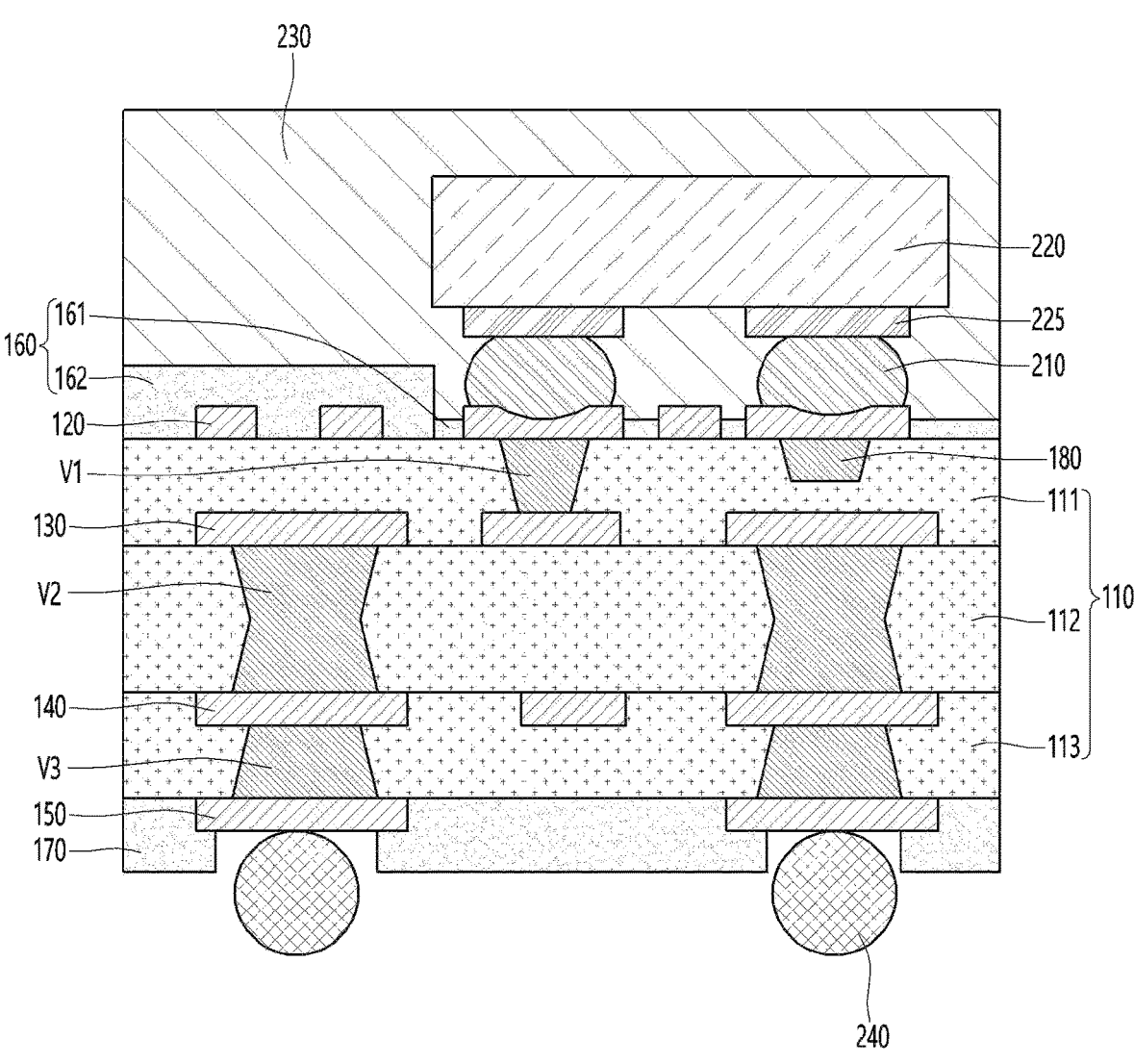

【FIG. 5A】
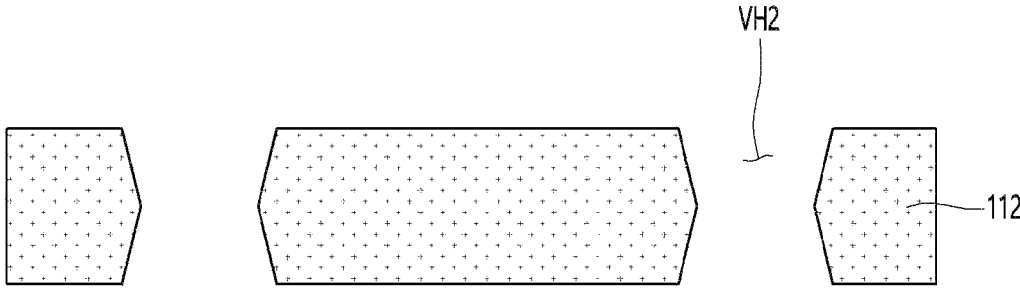
【FIG. 5B】
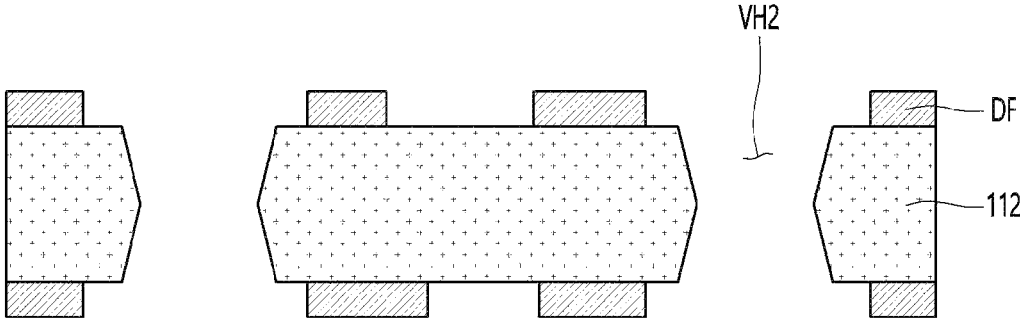
【FIG. 5C】
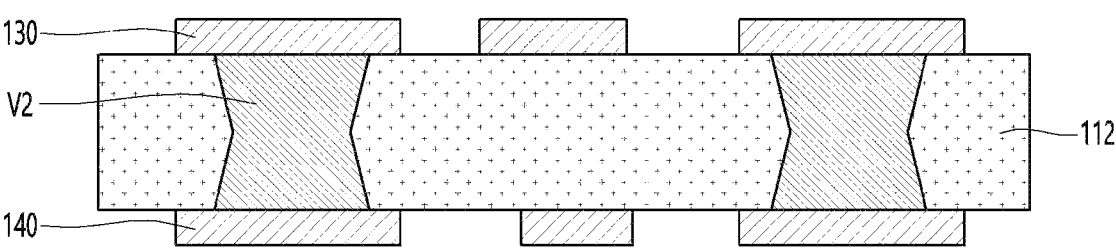

【FIG. 5D】
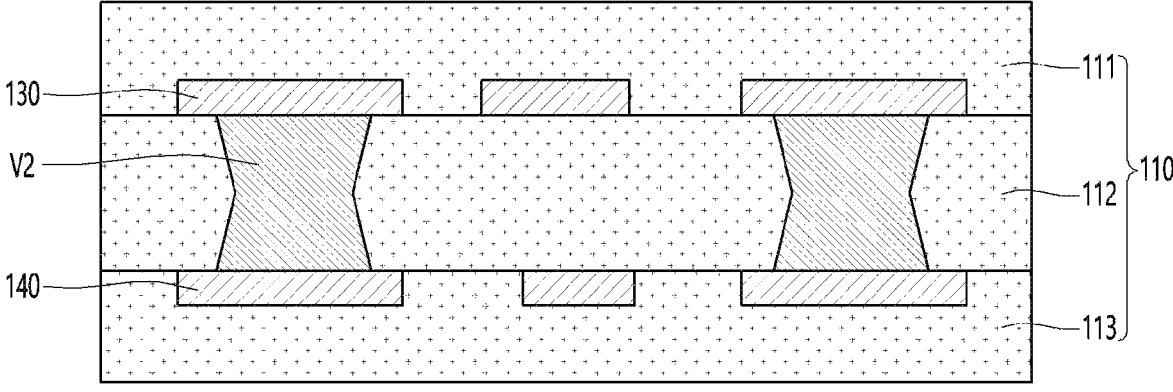
【FIG. 5E】
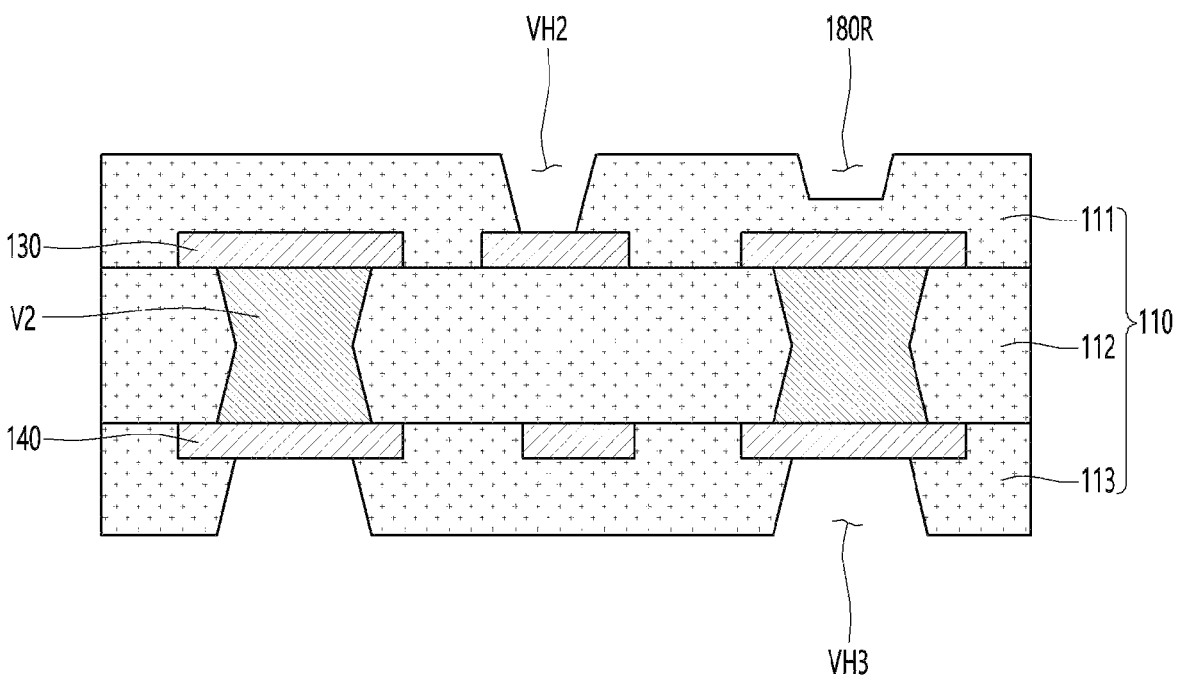

【FIG. 5F】
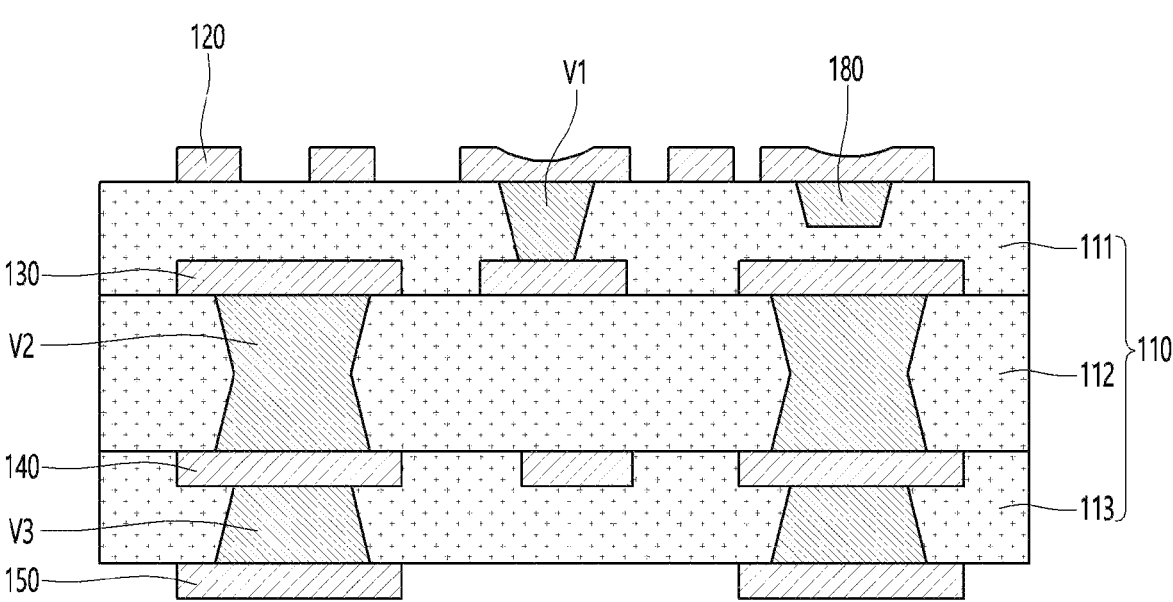

【FIG. 5G】
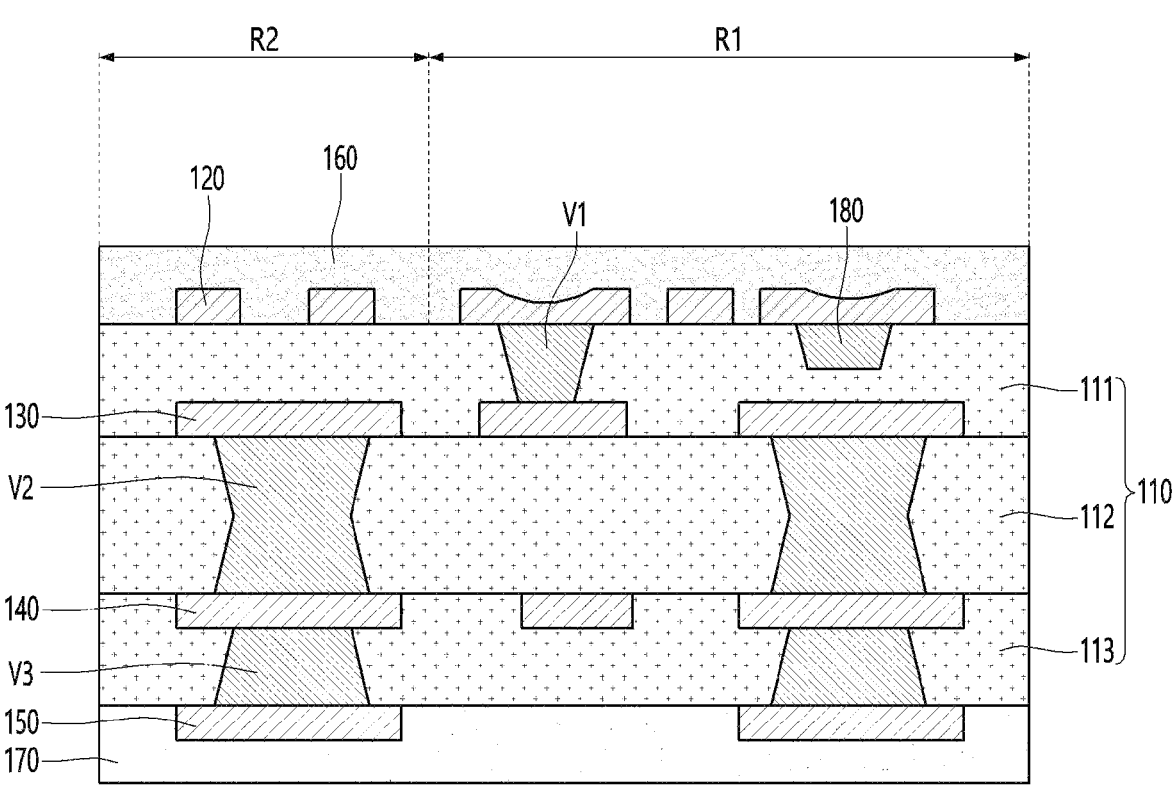

【FIG. 5H】
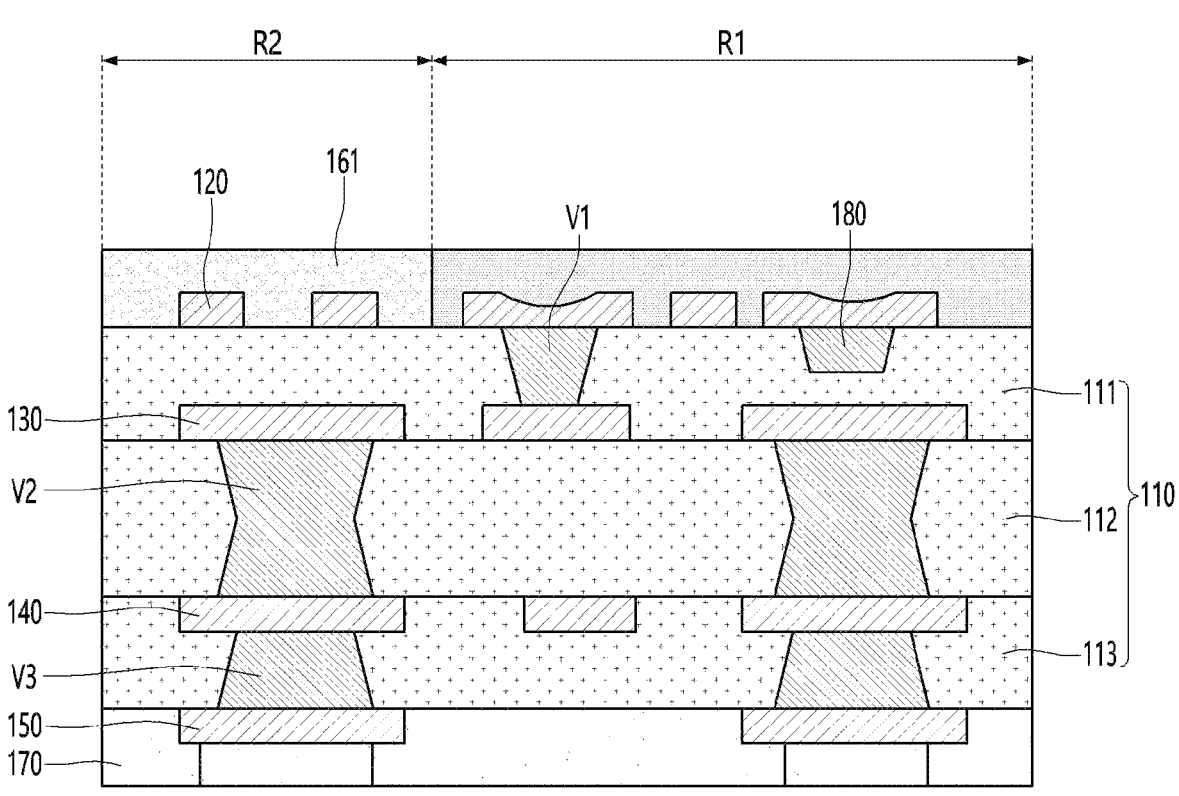

【FIG. 5I】
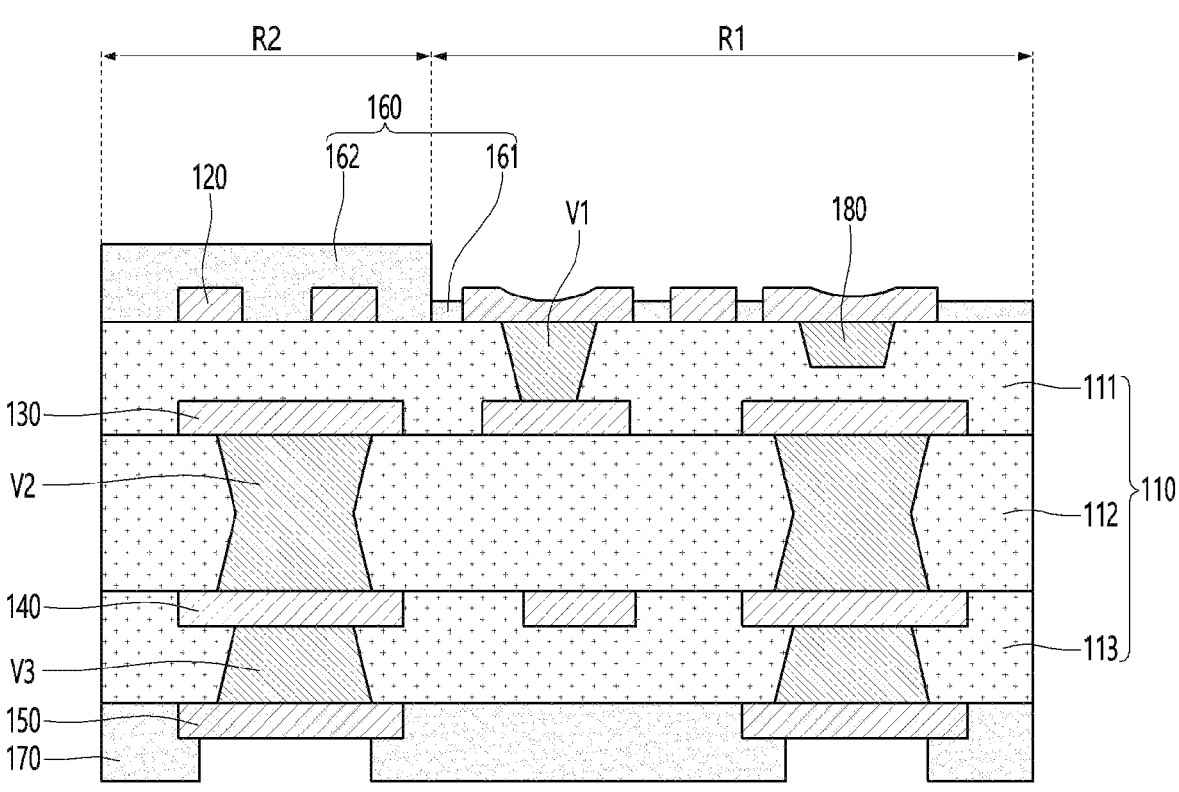

CIRCUIT BOARD

CROSS-REFERENCE TO RELATED PATENT APPLICATIONS

This application is a U.S. National Stage Application under 35 U.S.C. § 371 of PCT Application No. PCT/KR2022/013692, filed Sep. 14, 2022, which claims priority to Korean Patent Application No. 10-2021-0124374, filed Sep. 16, 2021, whose entire disclosures are hereby incorporated by reference.

TECHNICAL FIELD

The embodiment relates to a circuit board, and particularly to a circuit board and a semiconductor package including the same.

BACKGROUND ART

Generally, a printed circuit board (PCB) is a laminated structure in which insulating layers and conductor layers are alternately laminated, and the conductor layers may be provided with a circuit pattern by patterning.

Such printed circuit board includes a solder resist SR that protects the circuit pattern formed on an outermost side of the laminate structure, prevents oxidation of the conductor layer, and serves as an insulator when electrically connected to a chip mounted on a printed circuit board or another board.

A typical solder resist includes an opening region (SRO: Solder Resist Opening) where connection means such as solder or bumps are combined to form an electrical connection path. The opening region of the solder resist is required as the I/O (Input/Output) performance improves as the high performance and density of printed circuit boards increase, thereby a small bump pitch of the opening region is required. At this time, the bump pitch of the opening region refers to a center distance between adjacent opening regions.

Meanwhile, the opening region SRO of the solder resist includes a Solder Mask Defined (SMD) type and a Non-Solder Mask Defined (NSMD) type.

The SMD type is characterized in that a width of the opening region SRO is smaller than a width of the pad exposed through the opening region SRO, and accordingly, in the SMD type, at least a portion of an upper surface of the pad is covered by the solder resist.

In addition, the NSMD type is characterized in that a width of the opening region SRO is larger than a width of the pad exposed through the opening region SRO, and accordingly, the solder resist in the NSMD type is spaced apart from the pad at a certain interval and has a structure in which both the upper and side surfaces of the pad are exposed.

For example, the opening region of the NSMD type has a structure that entirely opens a first region in an upper region of the circuit board where the solder resist should not be disposed. At this time, there is a pad connected to a chip and a trace connected to the pad in the first region. Additionally, the pad and trace in the first region have a structure that is entirely exposed through the opening region of the solder resist.

However, the trace is becoming increasingly finer in recent years due to improved performance. Since there is no support layer that can support the trace in the first region, there is a problem that it easily collapses from various factors.

Additionally, a connection part such as a solder ball is disposed on the pad of the first region. However, there is no solder resist that functions as a dam to prevent overflow of the solder ball around the pad of the first region, and as a result, electrical shorts and reliability problems occur due to the overflow of the solder balls.

DISCLOSURE

Technical Problem

An embodiment provides a circuit board with a new structure and a semiconductor package including the same.

Additionally, the embodiment provides a circuit board including a pad structured to prevent solder balls from overflowing, and a semiconductor package including the same.

Additionally, the embodiment provides a circuit board with improved warpage characteristics and a semiconductor package including the same.

Additionally, the embodiment provides a circuit board with improved rigidity and a semiconductor package including the same.

Technical problems to be solved by the proposed embodiments are not limited to the above-mentioned technical problems, and other technical problems not mentioned may be clearly understood by those skilled in the art to which the embodiments proposed from the following descriptions belong.

Technical Solution

A circuit board according to an embodiment comprises a first insulating layer; a first circuit pattern layer disposed on the first insulating layer and including a first pad; a second circuit pattern layer disposed on a lower surface of the first insulating layer; and a first electrode part disposed in the first insulating layer and vertically overlapping the first pad, wherein a lower surface of the first electrode part is located higher than an upper surface of the second circuit pattern layer, and wherein the first pad includes a first concave portion formed in a region that vertically overlaps the first electrode part.

In addition, an upper surface of the first electrode part is in direct contact with a lower surface of the first pad, and wherein the lower surface of the first electrode part is spaced apart from the upper surface of the second circuit pattern layer.

In addition, a thickness of the first electrode part satisfies a range of 20% to 80% of a thickness of the first insulating layer, and wherein the thickness of the first insulating layer is a vertical distance between a lower surface of the first circuit pattern layer and the upper surface of the second circuit pattern layer.

In addition, the first pad includes a first-first portion that vertically overlaps the first electrode part, and a first-second portion that does not vertically overlap the first electrode part, and wherein the first concave portion is provided at the first-first portion of the first pad.

In addition, an upper surface of the first-second portion of the first pad includes a curved surface whose height decreases as it moves away from the first-first portion.

In addition, the first circuit pattern layer includes a second pad spaced apart from the first pad, wherein a second electrode part is provided to pass through the first insulating layer vertically overlapping the second pad, and wherein an upper surface of the second electrode part is in direct contact with a lower surface of the second pad, and wherein a lower surface of the second electrode part is in direct contact with the second circuit pattern layer.

In addition, the second pad includes a second concave portion formed in a region that vertically overlaps the second electrode part.

In addition, a width of the first electrode part corresponds to a width of the second electrode part, and wherein a depth of the first concave portion is smaller than a depth of the second concave portion.

In addition, a width of the first electrode part is greater than a width of the second electrode part, and wherein a depth of the first concave portion corresponds to a depth of the second concave portion.

In addition, the width of the first electrode part satisfies a range of 120% to 180% of the width of the second electrode part.

In addition, a surface roughness of the lower surface of the first electrode part is greater than a surface roughness of the lower surface of the second electrode part.

In addition, the lower surface of the first electrode part includes at least one of a first curved surface convex toward the first circuit pattern layer and a second curved surface convex toward the second circuit pattern layer.

In addition, the circuit board further comprises a second electrode part passing through the first insulating layer, an upper surface of the second electrode part is in direct contact with the first pad and a lower surface of the second electrode part is in direct contact with the upper surface of the second circuit pattern layer, and wherein the first pad includes a first region vertically overlapping with the first electrode part and a second region that vertically overlaps the second electrode part, wherein the first concave portion is formed on the upper surface of the first region of the first pad, and the first pad includes a second concave portion formed on the upper surface of the second region.

In addition, the circuit board further comprises a first protective layer disposed on the upper surface of the first insulating layer, and wherein the first protective layer includes a first portion having a height lower than the first pad and disposed surrounding a side surface of the first pad.

Meanwhile, a semiconductor package according to the embodiment comprises a first insulating layer; a first circuit pattern layer including a first pad and a second pad disposed on the first insulating layer; a second circuit pattern layer disposed on a lower surface of the first insulating layer; a first electrode part disposed in the first insulating layer and vertically overlapping the first pad; a second electrode part disposed in the first insulating layer and vertically overlapping the second pad; a first connection part disposed on the first pad and the second pad; a chip mounted on the first connection part; and a molding layer for molding the chip, wherein the first electrode part has a thickness less than a thickness of the first insulating layer, the second electrode part has a thickness corresponding to the thickness of the first insulating layer, the first pad includes a first concave portion formed in a region that vertically overlaps the first electrode part, and the second pad includes a second concave portion formed in a region that vertically overlaps the second electrode part.

In addition, the first connection part includes a first-first connection part disposed on the first pad and filling the first concave portion; and a first-second connection part disposed on the second pad and filling the second concave portion.

In addition, the chip includes a first chip and a second chip that are spaced apart from each other in a width direction or arranged in a vertical direction on the first insulating layer.

Advantageous Effects

The circuit board of the embodiment includes a first pad and a second pad disposed on an upper surface of a first insulating layer. Additionally, a first electrode part is disposed in the first insulating layer to vertically overlap the first pad, and a second electrode part is disposed in the first insulating layer to vertically overlap the second pad. The second electrode part is a via that electrically connects the second circuit pattern layer disposed on a lower surface of the first insulating layer and the second pad. In contrast, the first electrode part does not passes through the first insulating layer and therefore does not directly contact the second circuit pattern layer. For example, a lower surface of the first electrode part may be positioned higher than an upper surface of the second circuit pattern layer. That is, the first electrode part does not function to electrically connect the first pad and the second circuit pattern layer, and may be a dummy electrode for forming a first concave portion on the upper surface of the first pad. Accordingly, a first concave portion corresponding to the first electrode part is formed on the upper surface of the first pad of the embodiment. Accordingly, the embodiment allows a first concave portion to be formed on the upper surface of the first pad, thereby preventing overflow of connection parts such as solder balls disposed on the first pad. In addition, the embodiment prevents overflow of the connection part, so that the connection part can be stably placed on the first pad, and this can improve the adhesion between the first pads of the connection part. Furthermore, the embodiment prevents the connection part from overflowing, so that it is possible to prevent the connection part from contacting a circuit pattern (e.g., a trace) adjacent to the first pad, and this can solve electrical reliability problems such as circuit shorts.

Additionally, a second concave portion corresponding to the second electrode part is formed on an upper surface of the second pad in the embodiment. At this time, a thickness of the first electrode part is smaller than a thickness of the second electrode part. Accordingly, when the first electrode part and the second electrode part have a same width, a depth of the first concave portion may be smaller than a depth of the second concave portion. At this time, a first-first connection part may be disposed on the first pad, and a first-second connection part may be disposed on the second pad. At this time, if the depth of the first concave portion and the depth of the second concave portion are different from each other, there may be a difference between the height of the first-first connection part and the height of the first-second connection part. In addition, if the height of the first-first connection part and the height of the first-second connection part are different from each other, the chip may be mounted in an inclined state on the first-first connection part and the first-second connection part, and this may cause reliability problems. Accordingly, the embodiment allows the width of the first electrode part to be greater than the width of the second electrode part, so that the depth of the first concave portion and the depth of the second concave portion are substantially the same. Accordingly, the embodiment allows the height of the first-first connection part and the height of the first-second connection part to have the same height, thereby improving mount characteristics of the chip.

DESCRIPTION OF DRAWINGS

FIG. 1A is a diagram showing a circuit board according to a comparative example.

FIG. 1B is a diagram for explaining problems with the circuit board of the comparative example of FIG. 1A.

FIG. 2 is a cross-sectional view of a circuit board according to an embodiment.

FIG. 3A is an enlarged view of one region of a circuit board of FIG. 2 according to a first embodiment.

FIG. 3B is an enlarged view of one region of a circuit board of FIG. 2 according to a second embodiment.

FIG. 3C is an enlarged view of one region of a circuit board of FIG. 2 according to a third embodiment.

FIG. 3D is an enlarged view of one region of a circuit board of FIG. 2 according to a first embodiment.

FIG. 4 is a diagram showing a semiconductor package according to an embodiment.

FIGS. 5A to 5I are diagrams showing a method of manufacturing a circuit board according to the first embodiment in order of processes.

MODES OF THE INVENTION

Hereinafter, the embodiment disclosed in the present specification will be described in detail with reference to the accompanying drawings, but the same or similar components are designated by the same reference numerals regardless of drawing numbers, and repeated description thereof will be omitted. The component suffixes "module" and "part" used in the following description are given or mixed together only considering the ease of creating the specification, and have no meanings or roles that are distinguished from each other by themselves. In addition, in describing the embodiments disclosed in the present specification, when it is determined that detailed descriptions of a related well-known art unnecessarily obscure gist of the embodiments disclosed in the present specification, the detailed description thereof will be omitted. Further, the accompanying drawings are merely for facilitating understanding of the embodiments disclosed in the present specification, the technological scope disclosed in the present specification is not limited by the accompanying drawings, and it should be understood as including all modifications, equivalents and alternatives that fall within the spirit and scope of the present invention.

It will be understood that, although the terms "first," "second," etc. may be used herein to describe various elements, these elements should not be limited by these terms. These terms are only used to distinguish one element from another.

It will be understood that when an element is referred to as being "connected" or "coupled" to another element, it can be directly connected or coupled to the other element or intervening elements may be present. In contrast, when an element is referred to as being "directly connected" or "directly coupled" to another element, it will be understood that there are no intervening elements present.

As used herein, a singular expression includes a plural expression, unless the context clearly indicates otherwise.

It will be understood that the terms "comprise", "include", or "have" specify the presence of stated features, integers, steps, operations, elements, components and/or groups thereof disclosed in the present specification, but do not preclude the possibility of the presence or addition of one or more other features, integers, steps, operations, elements, components, and/or groups thereof.

Hereinafter, embodiments of the present invention will be described in detail with reference to the accompanying drawings.

Comparative Example

Before describing the embodiment, a comparative example compared to the circuit board of the embodiment of the present application will be described.

FIG. 1A is a diagram showing a circuit board according to a comparative example, and FIG. 1B is a diagram for explaining problems with the circuit board of the comparative example of FIG. 1A.

Referring to FIG. 1A, the circuit board of the comparative example includes an insulating layer 10, a first circuit pattern layer 20, a second circuit pattern layer 30, a through electrode part 40, and a protective layer 50.

At this time, the circuit board of the comparative example in FIG. 1A may have a single-layer structure or a multi-layer structure based on the number of insulating layers. Also, when the circuit board has a multi-layer structure, the insulating layer 10 in FIG. 1A represents an insulating layer disposed at the uppermost side in the circuit board of the multi-layer structure.

A first circuit pattern layer 20 is disposed on an upper surface of the insulating layer 10.

In addition, a second circuit pattern layer 30 is disposed on a lower surface of the insulating layer 10.

In addition, a through electrode part 40 is disposed to pass through the insulating layer 10 and connects the first circuit pattern layer 20 and the second circuit pattern layer 30 to each other. The through electrode part 40 passes through the insulating layer 10 and functions to electrically connect circuit pattern layers arranged in different layers to each other. The through electrode part 40 may also be referred to as a 'via'.

At this time, a protective layer 50 is disposed on the upper surface of the insulating layer 10. The protective layer 50 may include an opening (OR). For example, the protective layer 50 is disposed on the upper surface of the insulating layer 10 and includes an opening OR that vertically overlaps a portion of an upper region of the insulating layer 10.

Meanwhile, at least a portion of the first circuit pattern layer 20 disposed on the upper surface of the insulating layer 10 vertically overlaps the opening OR of the protective layer 50. For example, the first circuit pattern layer 20 includes a pad 21 that vertically overlaps the opening OR and is used as a mounting portion on which a chip is mounted.

At this time, a trace 22 along with the pad 21 is disposed on the upper surface of the insulating layer 10 that vertically overlaps the opening.

In addition, a structure of this comparative example may cause problems in the physical reliability of the trace 22 vertically overlapping the opening OR.

For example, a line width of the trace 22 has recently tended to become finer as performance has improved, and this has a level of less than 15 um. In this case, there is no structure that functions to protect the trace 22, and reliability problems are occurring as the trace 22 is easily exposed to various risk factors in a process of manufacturing a circuit board. For example, the trace 22 has a fine line width, and accordingly, there is no protective layer supporting the trace 22 in a state where the contact area with the insulating layer 10 is low, and there is a problem of separation from the insulating layer 10 due to external shock.

In addition, a process of manufacturing the circuit board includes an etching process of the first circuit pattern layer 20 to remove debris from the protective layer 50, which is a process after forming an opening OR in the protective layer 50. For example, the etching process may be performed on the pad 21 and the trace 22 that vertically overlap the opening OR among the first circuit pattern layer 20. However, in the above etching process, the shapes of the pad 21 and the trace 22 change, resulting in reliability problems.

For example, as shown in FIG. 1B, when the etching process is performed, a vertical cross section of the pad 21 has a curved surface that is convex toward an upward direction. This is because the edge region of the pad 21 undergoes more etching than the central region in the etching process.

And, as shown in (a) of FIG. 1B, an upper surface of the pad 21 has a convex shape whose height decreases from a center to an edge region.

In addition, as shown in (b) of FIG. 1B, a connection part 60 for mounting a chip is disposed on the pad 21. However, there is no protective layer 50 around the pad 21 that functions as a dam to prevent a flow of the connection part 60. Accordingly, during the reflow process of the connection part 60, a problem may occur where the connection part 60 overflows into a surrounding region of the pad. Also, when the connection part 60 overflows, at least a portion of the connection part 60 may contact the trace 22 disposed adjacent to the pad 21. Also, when the connection part 60 contacts the trace 22, there is a problem that a circuit short occurs as the pad 21 and the trace 22 are electrically connected to each other.

In addition, the pad 21 takes on a convex shape as the etching process progresses. In addition, when the pad 21 has a convex shape, there is a problem that the degree of overflow of the connection part 60 becomes more severe.

Accordingly, the embodiment provides a circuit board with a new structure and a semiconductor package including the same. Specifically, the embodiment provides a circuit board including a pad structured to prevent overflow of connection parts such as solder balls, and a semiconductor package including the same. For example, the embodiment includes a concave portion on an upper surface of the pad where the connection part is disposed, so that the connection part can be stably disposed on the pad.

Hereinafter, a circuit board and its semiconductor package according to an embodiment will be described in detail.

—Electronic Device—

Before describing an embodiment, an electronic device including a package substrate of an embodiment will be briefly described.

An electronic device includes a main board (not shown). The main board may be physically and/or electrically connected to various components. For example, the main board may be connected to the package substrate of the embodiment. Various semiconductor devices may be mounted on the package substrate. The chip mounted on the package substrate can include a memory chip such as a volatile memory (e.g., DRAM), a non-volatile memory (e.g., ROM), or a flash memory, an application processor (AP) chip such as a central processor (CPU), a graphic processor (GPU), antenna chip, a digital signal processor, a cryptographic processor, a microprocessor, and a microcontroller, or a logic chip such as analog-digital converters and ASICs (application-specific ICs).

In addition, the embodiment provides a semiconductor package that can mount at least two different types of chips on one substrate while reducing a thickness of the semiconductor package connected to the main board of the electronic device.

In this case, the electronic device may include a smart phone, a personal digital assistant, a digital video camera, a digital still camera, a network system, a computer, a monitor, a tablet, a laptop, a netbook, a television, a video game, a smart watch, an automotive, and the like. However, the embodiment is not limited thereto, and may be any other electronic device that processes data in addition to these.

Hereinafter, a circuit board and a semiconductor package including the same according to an embodiment will be described.

—Circuit Board—

FIG. 2 is a cross-sectional view of a circuit board according to an embodiment, FIG. 3A is an enlarged view of one region of a circuit board of FIG. 2 according to a first embodiment, FIG. 3B is an enlarged view of one region of a circuit board of FIG. 2 according to a second embodiment, FIG. 3C is an enlarged view of one region of a circuit board of FIG. 2 according to a third embodiment, and FIG. 3D is an enlarged view of one region of a circuit board of FIG. 2 according to a first embodiment.

A circuit board according to an embodiment will be described with reference to FIGS. 2 and 3A to 3D.

Referring to FIG. 2, a circuit board includes an insulating layer 110, a circuit pattern layer, vias, and a protective layer.

The insulating layer 110 may have a multiple layer structure. For example, the insulating layer 110 may include a first insulating layer 111, a second insulating layer 112, and a third insulating layer 113. At this time, the circuit board is shown in the drawing as having a three-layer structure based on the number of insulating layers, but it is not limited thereto. For example, the circuit board may have a structure (including single-layer structure) of two or less layers based on the number of insulating layers, or alternatively, may have a structure of four or more layers.

For example, the first insulating layer 111 may be a first outermost insulating layer disposed at an first outermost side in a multi-layer structure. For example, the first insulating layer 111 may be an insulating layer disposed at an uppermost side of the circuit board. The second insulating layer 112 may be an inner insulating layer disposed at an inside of a multi-layered circuit board. The third insulating layer 113 may be a second outermost insulating layer disposed at the second outermost side in a multi-layer structure. In addition, the inner insulating layer is shown as consisting of one layer, but if the circuit board has a layer structure of four or more layers, the inner insulating layer may have a layer structure of two or more layers.

The insulating layer 110 is a board equipped with an electric circuit whose wiring can be changed, and may include a print, a wiring board, and an insulating board made of an insulating material capable of forming circuit patterns on the surface.

For example, at least one of the insulating layer 110 may be rigid or flexible. For example, at least one of the insulating layer 110 may include glass or plastic. Specifically, the insulating layer 110 may include a chemically tempered/semi-tempered glass, such as soda lime glass, aluminosilicate glass, etc., a tempered or flexible plastic such as polyimide (PI), polyethylene terephthalate (PET), propylene glycol (PPG), polycarbonate (PC), etc., or sapphire.

In addition, at least one of the insulating layer 110 may include an optically isotropic film. For example, at least one of the insulating layer 110 may include cyclic olefin copolymer (COC), cyclic olefin polymer (COP), optically isotropic PC, optically isotropic polymethylmethacrylate (PMMA), or the like.

In addition, at least one of the insulating layer 110 may be formed of a material including an inorganic filler and an insulating resin. For example, at least one of the insulating layer 330 may be formed of a resin containing reinforcing materials such as inorganic fillers such as silica and alumina together with a thermosetting resin such as an epoxy resin or a thermoplastic resin such as polyimide, specifically Ajinomoto Build-up Film (ABF), FR-4, Bismaleimide Triazine (BT), Photo Imageable Dielectric resin (PID), BT, or the like.

In addition, at least one of the insulating layers 110 may have a partially curved surface and be curved. That is, at least one of the insulating layers 110 is partially flat, and at least one of the insulating layers 110 may have a partially curved surface and be bent. In detail, at least one end of the insulating layer 110 may have a curved surface and be bent, or at least one end of the insulating layer 110 has a surface with random curvature and may be curved or bent.

A circuit pattern layer may be disposed on a surface of the insulating layer 110.

For example, a first circuit pattern layer 120 may be disposed on a first or upper surface of the first insulating layer 111. For example, a second circuit pattern layer 130 may be disposed between a second surface or lower surface of the first insulating layer 111 and a first surface or upper surface of the second insulating layer 112. For example, a third circuit pattern layer 140 may be disposed between a second surface or lower surface of the second insulating layer 112 and a first surface or upper surface of the third insulating layer 113. For example, a fourth circuit pattern layer 150 may be disposed on a second or lower surface of the third insulating layer 113. A first circuit pattern layer 120 may be a circuit pattern layer disposed at a first outermost side or uppermost side of the circuit board. Additionally, the second circuit pattern layer 130 and the third circuit pattern layer 140 may be inner circuit pattern layers disposed inside the circuit board. Additionally, the fourth circuit pattern layer 150 may be a circuit pattern layer disposed at a second outermost side or lowermost side of the circuit board.

The first circuit pattern layer 120, the second circuit pattern layer 130, the third circuit pattern layer 140, and the fourth circuit pattern layer 150 is a wire that transmits electrical signals and may be formed of a metal material with high electrical conductivity. The first circuit pattern layer 120, the second circuit pattern layer 130, the third circuit pattern layer 140, and the fourth circuit pattern layer 150 may be formed of at least one metal material selected from among gold (Au), silver (Ag), platinum (Pt), titanium (Ti), tin (Sn), copper (Cu), and zinc (Zn). In addition, the first circuit pattern layer 120, the second circuit pattern layer 130, the third circuit pattern layer 140, and the fourth circuit pattern layer 150 may be formed of paste or solder paste including at least one metal material selected from among gold (Au), silver (Ag), platinum (Pt), titanium (Ti), tin (Sn), copper (Cu), and zinc (Zn), which are excellent in bonding force. Preferably, the first circuit pattern layer 120, the second circuit pattern layer 130, the third circuit pattern layer 140, and the fourth circuit pattern layer 150 may be formed of copper (Cu) having high electrical or thermal conductivity and a relatively low cost.

The first circuit pattern layer 120, the second circuit pattern layer 130, the third circuit pattern layer 140, and the fourth circuit pattern layer 150 can be formed using an additive process, a subtractive process, a modified semi additive process (MSAP) and a semi additive process (SAP), which is a typical circuit board manufacturing process, and a detailed description will be omitted here.

Meanwhile, each of the first to fourth circuit pattern layers 120, 130, 140, and 150 includes traces and pads.

The trace refers to a long line-shaped wiring that transmits electrical signals. Additionally, the pad may refer to a mounting pad on which components such as chips are mounted, a core pad or BGA pad for connection to an external board, or a via pad connected to a via.

A via corresponding to a second electrode part described below may be formed in the insulating layer 110. The via is formed to pass through the insulating layer 110, and thus can electrically connect circuit pattern layers arranged in different layers.

For example, a first via V1 may be formed in the first insulating layer 111. The first via V1 passes through the first insulating layer 111, and thus can electrically connect the first circuit pattern layer 120 and the second circuit pattern layer 130. The first via V1 may refer to the second electrode part described below.

For example, a second via V2 may be formed in the second insulating layer 112. The second via V2 passes through the second insulating layer 112, and thus can electrically connect the second circuit pattern layer 130 and the third circuit pattern layer 140. At this time, the second insulating layer 112 may be a core layer. And, when the second insulating layer 112 is a core layer, the second via V2 may have an hourglass shape. For example, when the circuit board of the embodiment is a coreless board, the second via V2 may have a same shape as the first via V1 or the third via V3.

For example, a third via V3 may be formed in the third insulating layer 113. The third via V3 passes through the third insulating layer 113, and thus can electrically connect the third circuit pattern layer 140 and the fourth circuit pattern layer 150.

The vias V1, V2 and V3 as described above may be formed by filling the inside of a through hole formed in each insulating layer with a metal material. The through hole may be formed by any one of mechanical, laser, and chemical processing. When the via hole is formed by mechanical processing, a method such as milling, drilling and routing may be used, when the via hole is formed by laser processing, a method of UV or $CO_2$ laser may be used, when the via hole is formed by chemical processing, a chemical including amino silane, ketones, or the like may be used. Accordingly, at least one insulating layer among the plurality of insulating layers may be opened.

When the through hole is formed, the vias V1, V2, and V3 may be formed by filling the inside of the through hole with a conductive material. The metal material forming the vias V1, V2, and V3 may be any one selected from among copper (Cu), silver (Ag), tin (Sn), gold (Au), nickel (Ni), and palladium (Pd). In addition, the conductive material may be filled by any one of electroless plating, electroplating, screen printing, sputtering, evaporation, ink jetting, and dispensing, or a combination thereof.

Meanwhile, a first protective layer 160 may be disposed on the first or upper surface of the first insulating layer 111. The first protective layer 160 may include a solder resist. The first protective layer 160 may include an opening region exposing a surface of the first circuit pattern layer 190. For example, the first protective layer 160 may include a first region R1 including an opening, and a second region R2 excluding the first region R1.

The first region R1 of the first protective layer 160 may include an opening that vertically overlaps the first circuit pattern layer 120. Accordingly, the first circuit pattern layer 120 vertically overlapping the first region R1 is not covered by the first protective layer 160. For example, an entire upper surface and a partial side surface of the first circuit pattern layer 120 vertically overlapping with the first region R1 of the first protective layer 160 are not covered by the first protective layer 160.

The second region R2 of the first protective layer 160 may not include the opening. For example, the first circuit pattern layer 120 vertically overlapping the second region R2 of the first protective layer 160 may be covered by the first protective layer 160. For example, the first circuit pattern layer 120 vertically overlapping the second region R2 of the first protective layer 160 may be embedded in the first protective layer 160. However, the embodiment is not limited thereto. For example, the second region R2 of the first protective layer 160 may include at least one opening of a solder mask defined type (SMD). Additionally, a connection part such as a solder ball may be disposed on the first circuit pattern layer 120 vertically overlapping the opening of the SMD (Solder Mask Defined type). However, when a connection part is disposed on the first circuit pattern layer 120 that vertically overlaps the opening of the SMD (Solder Mask Defined type), an inner wall of the SMD type opening may function as a dam to block the flow of the connection part. Accordingly, the first circuit pattern layer 120 that vertically overlaps the opening of the SMD (Solder Mask Defined type) does not need to include a concave portion described below. However, the embodiment is not limited thereto. For example, a concave portion described below may also be formed on the upper surface of the pad of the first circuit pattern layer 120 vertically overlaps the second region R2 of the first protective layer 160 and vertically overlaps the opening of the SMD type.

The first region R1 of the first protective layer 160 and the second region R2 of the first protective layer 160 may have different thicknesses. For example, the first region R1 of the first protective layer 160 may have a first thickness. For example, the first thickness of the first region R1 of the first protective layer 160 may be smaller than a thickness of the first circuit pattern layer 120. Accordingly, a portion of a side surface of the first circuit pattern layer 120 vertically overlapping with the first region (R1) of the first protective layer 160 may be covered with a first region R1 of the first protective layer 160, and a remaining part of the side surface of the first circuit pattern layer 120 may not be covered by the first protective layer 160. For example, a first portion 161 of the first protective layer 160 is disposed in the first region R1. Also, a second portion 162 of the first protective layer 160 is disposed in the second region R2. The first region R1 of the first protective layer 160 may refer to a first portion 161 of the first protective layer 160. Additionally, a second region R2 of the first protective layer 160 may refer to the second portion 162 of the first protective layer 160.

A thickness of the second region R2 of the first protective layer 160 may be greater than a thickness of the first region R1 of the first protective layer 160. For example, a thickness of the second region R2 of the first protective layer 160 may be greater than the thickness of the first circuit pattern layer 120. Accordingly, the first circuit pattern layer 120 vertically overlapping the second region R2 of the first protective layer 160 may be covered with the first protective layer 160.

Correspondingly, a second protective layer 170 may be disposed on the second surface of the third insulating layer 113. The second protective layer 170 may include a solder resist. The second protective layer 170 may include an opening (not shown) that vertically overlaps a pad (not shown) of the fourth circuit pattern layer 150.

Meanwhile, in the embodiment, a plurality of electrode parts are disposed in the first insulating layer 111. The electrode part may pass through the first insulating layer 111, or alternatively, may not pass through the first insulating layer 111.

For example, the plurality of electrode parts may include a first electrode part and a second electrode part. A first electrode part 180 may not pass through the first insulating layer 111. For example, a thickness of the first electrode part 180 may be smaller than a thickness of the first insulating layer 111. For example, the first electrode part 180 may not be connected to the second circuit pattern layer 130. For example, a lower surface of the first electrode part 180 may be positioned higher than an upper surface of the second circuit pattern layer 130. Through this, the first electrode part 180 may not directly contact the second circuit pattern layer 130. This will be described below.

A second electrode part may be spaced apart from the first electrode part 180 in a width or length direction within the first insulating layer 111. The second electrode part may pass through the first insulating layer 111. For example, a thickness of the second electrode part may be same as a thickness of the first insulating layer 111. For example, the second electrode part may be directly connected to the second circuit pattern layer 130. For example, a lower surface of the second electrode part may directly contact an upper surface of the second circuit pattern layer 130. The second electrode part may have a thickness greater than the thickness of the first electrode part 180.

The second electrode part may correspond to the first via V1 described above. Accordingly, the second electrode part and the first via may express one component in different terms. Hereinafter, the first via V1 will be described as a 'second electrode part'.

Meanwhile, the first electrode part 180 and the second electrode part V1 may be disposed in a region that vertically overlaps the first region R1 of the first protective layer 160 within the first insulating layer 111. In addition, the first electrode part 180 and the second electrode part V1 may also be disposed in a region that vertically overlaps the second region R2 of the first protective layer 160 within the first insulating layer 111. However, the circuit board of the embodiment includes a structure that blocks a flow of connection parts such as solder balls. And, the structure that blocks the flow of the connection part can be applied to both the first region R1 and the second region R2 of the first protective layer 160. However, an effect can be maximized when applied to the first region R1 of the first protective layer 160. Accordingly, the following description will focus on the first region R1 of the first protective layer 160.

Referring to FIG. 3A, the circuit board of the first embodiment includes a first insulating layer 111, a first circuit pattern layer 120, a second circuit pattern layer 130, and a first protective layer 160.

The first circuit pattern layer 120 is disposed on an upper surface of the first insulating layer 111.

For example, the first circuit pattern layer 120 may include a first pad 121 and a second pad 122 disposed on the upper surface of the first insulating layer 111 that vertically overlaps the first region R1 of the first protective layer 160. Additionally, the first circuit pattern layer 120 may include a trace 123 disposed between the first pad 121 and the second pad 122.

At this time, the first pad 121 and the second pad 122 may be distinguished according to a design of the circuit board.

For example, the first circuit pattern layer 120 includes a pad on which a chip is mounted or coupled to an external board. For example, the first circuit pattern layer 120 includes pads on which connection parts such as solder balls are disposed. For example, the first circuit pattern layer 120 includes a pad that vertically overlaps the opening of the first protective layer 160.

At this time, the pads of the first circuit pattern layer 120 may be directly connected to the second circuit pattern layer 130 through a via, or alternatively, the pads of the first circuit pattern layer 120 may be indirectly connected through a trace. Also, the embodiment may be divided into a first pad 121 and a second pad 122 according to a connection structure between the pads and the second circuit pattern layer 130.

The first pad 121 may refer to a pad that is not directly connected to the second circuit pattern layer 130 through a via. For example, the via may not be disposed on the first insulating layer 111 that vertically overlaps the first pad 121.

For example, the first pad 121 may be electrically connected to the second circuit pattern layer 130 through the trace 123 of the second circuit pattern layer 120.

The second pad 122 may refer to a pad directly connected to the second circuit pattern layer 130 through a via. For example, a first via V1 that vertically overlaps the second pad 122 may be formed in the first insulating layer 111. For example, a second electrode part V1 that vertically overlaps the second pad 122 may be formed in the first insulating layer 111.

The first circuit pattern layer 120 including the first pad 121, the second pad 122, and the trace 123 may have a first thickness T1. For example, the first thickness T1 of the first circuit pattern layer 120 may satisfy a range of 5 um to 20 um. For example, the first thickness T1 of the first circuit pattern layer 120 may satisfy a range of 8 um to 18 um. For example, the first thickness T1 of the first circuit pattern layer 120 may satisfy a range of 10 μm to 15 μm. If the first thickness T1 of the first circuit pattern layer 120 is less than 5 um, the resistance of the circuit pattern increases, and signal transmission efficiency may decrease accordingly. For example, if the first thickness T1 of the first circuit pattern layer 120 is less than 5 μm, signal transmission loss may increase. For example, if the first thickness T1 of the first circuit pattern layer 120 is less than 5 μm, signal transmission loss due to the skin effect may increase when transmitting a high-frequency signal.

In addition, if the first thickness T1 of the first circuit pattern layer 120 exceeds 20 um, a line width and spacing of the circuit patterns increase corresponding to the thickness of the first circuit pattern layer 120, and an overall volume of the circuit board may increase accordingly.

At this time, a shape of the first pad 121 and the second pad 122 may different from a shape of the trace 123. For example, the first pad 121 and the second pad 122 may change shape through an etching process, which is a pre-treatment process performed before surface treatment. In contrast, the trace 123 is not subjected to the etching process. Accordingly, the trace 123 may have a shape different from a shape of the first pad 121 and the second pad 122. For example, the trace 123 does not change shape differently from the first pad 121 and the second pad 122.

Accordingly, each of the first pad 121 and the second pad 122 may include a portion whose thickness changes for each region. Accordingly, the first thickness T1 of each of the first pad 121 and the second pad 122 may mean a thickness in a region having a maximum thickness or an average thickness.

Meanwhile, a first protective layer 160 is disposed on the upper surface of the first insulating layer 111. That is, an opening that vertically overlaps the first pad 121, the second pad 122, and the trace 123 is provided on the upper surface of the first insulating layer 111.

For example, the first portion 161 of the first protective layer 160 that does not vertically overlap the first pad 121, the second pad 122, and the trace 123 is formed on the first insulating layer 111. For example, the first portion 161 of the first protective layer 160 does not vertically overlap the first pad 121, the second pad 122, and the trace 123. For example, the first portion 161 of the first protective layer 160 may be disposed on a region of the upper surface of the first insulating layer 111 where the first pad 121, the second pad 122, and the trace 123 are not disposed.

Accordingly, the first portion 161 of the first protective layer 160 may have a second thickness T2 that is smaller than the first thickness T1 of the first circuit pattern layer 120. The second thickness T2 of the first portion 161 of the first protective layer 160 may satisfy a range of 20% to 90% of the first thickness T1 of the first circuit pattern layer 120. For example, the second thickness T2 of the first portion 161 of the first protective layer 160 may satisfy a range of 30% to 85% of the first thickness T1 of the first circuit pattern layer 120. For example, the second thickness T2 of the first portion 161 of the first protective layer 160 may satisfy a range of 40% to 80% of the first thickness T1 of the first circuit pattern layer 120.

The first portion 161 of the first protective layer 160 may function to support the first circuit pattern layer 120 while protecting the upper surface of the first insulating layer 111 in the first region R1. Preferably, the first portion 161 of the first protective layer 160 may function to support the trace 123 in the first region R1.

If the second thickness T2 of the first portion 161 of the first protective layer 160 is less than 20% of the first thickness T1 of the first circuit pattern layer 120, a problem may occur in which the trace 123 is not stably supported by the first portion 161 of the first protective layer 160, and as a result, a protective effect of the trace 123 may be reduced.

A process error occurs in the process of forming the first portion 161 of the first protective layer 160, and this may cause a problem in which a portion of the first protective layer 160 remains on the first pad 121 or the second pad 122. And, if a portion of the first protective layer 160 remains on the first pad 121 and the second pad 122, physical reliability problems may occur, such as deterioration of adhesion to connection parts such as solder balls, or electrical reliability problems may occur, as connectivity with chips deteriorates.

Meanwhile, the second circuit pattern layer 130 may have a third thickness T3 that is same as the first thickness T1 of the first circuit pattern layer 120. However, the embodiment is not limited thereto. For example, the third thickness T3 of the second circuit pattern layer 130 may be smaller than the first thickness T1 of the first circuit pattern layer 120, or may be greater than the first thickness T1 of the first circuit pattern layer 120. However, in the embodiment, the third thickness T3 of the second circuit pattern layer 130 and the first thickness T1 of the first circuit pattern layer 120 are substantially the same. For example, the third thickness T3 of the second circuit pattern layer 130 may satisfy a range of 95% to 105% of the first thickness T1 of the first circuit pattern layer 120.

Meanwhile, a first electrode part 180 vertically overlapping the first pad 121 is disposed on the first insulating layer 111.

The first electrode part 180 may also be referred to as a dummy electrode part or a dummy via. Additionally, the first electrode part 180 may also be referred to as a non-passing electrode.

The first electrode part 180 may be formed without passing through the first insulating layer 111. For example, the first electrode part 180 may have a fifth thickness T5 that is smaller than the fourth thickness T4 of the first insulating layer 111.

The first electrode part 180 may be disposed within the first insulating layer 111 that vertically overlaps the first pad 121 so that the first concave portion 121-11 is provided on the first pad 121.

That is, a general electrode disposed in the first insulating layer functions to electrically connect between the first circuit pattern layer and the second circuit pattern layer. At this time, the first electrode part 180 does not function to electrically connect the first circuit pattern layer and the second circuit pattern layer, and the first electrode part 180 may be disposed within the first insulating layer 111 to form a concave portion on the upper surface of the first pad 121. Accordingly, the first electrode part 180 may be referred to as a dummy electrode. Accordingly, the first electrode part 180 has a structure that does not directly contact the second circuit pattern layer 130. For example, the second circuit pattern layer 130 may include an overlapping pattern that vertically overlaps the first electrode part 180. Additionally, the overlapping pattern does not contact the first electrode part 180 and may be spaced apart from the first electrode part 180.

For example, a process of manufacturing a typical circuit board includes a process of forming a via and circuit pattern layer by forming a through hole in the insulating layer and then performing a plating process. The via is formed passing through the insulating layer, and the circuit pattern layer is formed on the upper surface of the insulating layer. At this time, the circuit pattern layer includes an overlapping region that vertically overlaps the via and a non-overlapping region that does not vertically overlap the via. Meanwhile, the plating process simultaneously forms a via that fills the through hole and forms a circuit pattern layer on the upper surface of the insulating layer. Accordingly, the overlapping region of the circuit pattern layer vertically overlaps the through hole and the via, and accordingly, the overlapping region of the circuit pattern layer has a relatively small thickness compared to the non-overlapping region. For example, the overlapping region of the circuit pattern layer has a thickness smaller than of a thickness of the non-overlapping region. For example, a dimple such as a concave portion that is concave toward the via is formed in an overlapping region of the circuit pattern layer.

And, in the embodiment, the first concave portion 121-11 is included in the first pad 121 using the first electrode part 180.

That is, the first electrode part 180 may be formed on the first insulating layer 111 overlapping the first pad 121 to form a first concave portion 121-11 on the first pad 121. At this time, the first electrode part 180 may not function as a signal transmission but may be a dummy electrode for forming the first concave portion 121-11. Accordingly, the first electrode part 180 is not connected to the second circuit pattern layer 130. For example, if the first electrode part 180 is in contact with the second circuit pattern layer 130, electrical reliability problems such as circuit shorts may occur.

Accordingly, in an embodiment, the first electrode part 180 may be provided in the first insulating layer 111 with a fifth thickness T5 that is smaller than the fourth thickness T4 of the first insulating layer 111.

For example, the fourth thickness T4 of the first insulating layer 111 may range from 15 um to 50 um. For example, the fourth thickness T4 of the first insulating layer 111 may satisfy a range of 18 um to 40 um. For example, the fourth thickness T4 of the first insulating layer 111 may satisfy a range of 20 um to 35 um. If the fourth thickness T4 of the first insulating layer 111 is less than 15 um, an overall rigidity of the circuit board may be weakened. For example, if the fourth thickness T4 of the first insulating layer 111 is less than 15 um, a problem may occur in which the second circuit pattern layer 130 is not stably protected by the first insulating layer 111, and as a result, electrical reliability problems such as circuit shorts may occur. If the fourth thickness T4 of the first insulating layer 111 is greater than 50 um, an overall thickness of the circuit board may increase.

Meanwhile, the first electrode part 180 has a fifth thickness T5 that is smaller than the fourth thickness T4 of the first insulating layer 111. For example, the fifth thickness T5 of the first electrode part 180 may satisfy a range of 20% to 80% of the fourth thickness T4 of the first insulating layer 111. For example, the fifth thickness T5 of the first electrode part 180 may satisfy a range between 25% and 75% of the fourth thickness T4 of the first insulating layer 111. For example, the fifth thickness T5 of the first electrode part 180 may satisfy 30% to 70% of the fourth thickness T4 of the first insulating layer 111.

If the fifth thickness T5 of the first electrode part 180 is less than 20% of the fourth thickness T4 of the first insulating layer 111, the first concave portion 121-11 formed in the first pad 121 is not included, or alternatively, even if the first concave portion 121-11 is included, a problem may occur in which the flow of the connection part cannot be effectively blocked due to its small depth.

In addition, if the fifth thickness T5 of the first electrode part 180 is greater than 80% of the fourth thickness T4 of the first insulating layer 111, a distance between the lower surface of the first electrode part 180 and the upper surface of the second circuit pattern layer 130 becomes closer, as a result, electrical reliability problems may occur. For example, if the fifth thickness T5 of the first electrode part 180 is greater than 80% of the fourth thickness T4 of the first insulating layer 111, signal interference may occur between the first electrode part 180 and the second circuit pattern layer 130, and signal transmission efficiency of the second circuit pattern layer 130 may decrease. For example, if the fifth thickness T5 of the first electrode part 180 is greater than 80% of the fourth thickness T4 of the first insulating layer 111, a process error may occur in a process of forming the first electrode part 180, which may cause a problem in which the first electrode part 180 contacts the second circuit pattern layer 130.

Meanwhile, the fourth thickness T4 of the first insulating layer 111 may mean a vertical distance between neighboring circuit pattern layers. For example, the fourth thickness T4 of the first insulating layer 111 may mean a vertical distance between a lower surface of the first circuit pattern layer 120 and an upper surface of the second circuit pattern layer 130. And, the fifth thickness T5 of the first electrode part 180 may mean a vertical distance from the upper surface of the first electrode part 180 to the lower surface of the first electrode part 180.

The second electrode part V1 may be a via connecting the second circuit pattern layer 130 and the second pad 122.

The second electrode part V1 may be a via connecting the second circuit pattern layer 130 and the second pad 122. That is, the second electrode part V1 may be a through electrode that electrically connects the second circuit pattern layer 130 and the second pad 122.

Accordingly, the second electrode part V1 may have a thickness greater than the fifth thickness T5 of the first electrode part 180. For example, the second electrode part V1 may be same as a thickness of the first insulating layer 111. For example, the second electrode part V1 may have a fourth thickness T4 that is the same as the thickness of the first insulating layer 111.

Additionally, the second electrode part V1 is formed to pass through the first insulating layer 111 to electrically connect the second pad 122 and the second circuit pattern layer 130. Additionally, the second pad 122 may include a second concave portion 122-11 as it vertically overlaps the second electrode part V1.

That is, the second pad 122 has a second electrode part V1 corresponding to a via in a vertically overlapping region, and accordingly may include a second concave portion 122-11 on the upper surface of the second pad 122. In addition, a via that vertically overlaps the first pad 121 is not disposed in the insulating layer 111, so that the first pad 121 may not include a concave portion. Accordingly, the embodiment forms a first electrode part 180 that does not pass through the first insulating layer 111 within the first insulating layer 111 that overlaps the first pad 121, so that a first concave portion 121-11 may be formed on the first pad 121.

Meanwhile, the first pad 121 may include a first-first portion 121-1 that vertically overlaps the first electrode part 180 and a first-second portion 121-2 that does not vertically overlap the first electrode part 180. Also, a first concave portion 121-11 may be formed on the first-first portion 121-1 of the first pad 121. For example, an upper surface of the first-first portion 121-1 of the first pad 121 may have a shape concave toward the first electrode part 180. For example, a dimple may be formed on the first-first portion 121-1 of the first pad 121. Additionally, in an embodiment, the first concave portion 121-11 may not be formed on the first-second portion 121-2 of the first pad 121. At this time, the first pad 121 is etched according to the pretreatment process as described above. Accordingly, an upper surface of the first-second portion 121-2 of the first pad 121 may include a portion whose height changes. For example, a height of the upper surface of the first-second portion 121-2 of the first pad 121 may become lower as it moves away from the first-first portion 121-1. For example, the first-second portion 121-2 of the first pad 121 may include a convex curved surface.

Correspondingly, the second pad 122 may include a second-first portion 122-1 that vertically overlaps the second electrode part V1 and a second-second portion 122-2 that does not vertically overlap the second electrode part V1. Also, a second concave portion 122-11 may be formed on the second-first portion 122-1 of the second pad 122. For example, an upper surface of the second-first portion 122-1 of the second pad 122 may have a shape concave toward the second electrode part V1. For example, a dimple may be formed on the second-first portion 122-1 of the second pad 122. Additionally, in an embodiment, the second concave portion 122-11 may not be formed on the second-second portion 122-2 of the second pad 122. At this time, the second pad 122 is etched according to the pretreatment process as described above. Accordingly, the upper surface of the second-second portion 122-2 of the second pad 122 may include a portion whose height changes. For example, a height of the upper surface of the second-second portion 122-2 of the second pad 122 may decrease as it moves away from the second-first portion 122-1. For example, the second-second portion 122-2 of the second pad 122 may include a convex curved surface.

Meanwhile, a depth of each of the first concave portion 121-11 and the second concave portion 122-11 may vary in proportion to a thickness of each of the first electrode part 180 and the second electrode part V1. For example, as the thickness of the first electrode part 180 increases, the depth of the first concave portion 121-11 may increase. For example, as the thickness of the first electrode part 180 decreases, the depth of the first concave portion 121-11 may also decrease. For example, as the thickness of the second electrode part V1 increases, the depth of the second concave portion 122-11 may increase. For example, as the thickness of the second electrode part V1 decreases, the depth of the second concave portion 122-11 may also decrease.

At this time, the first electrode part 180 and the second electrode part V1 are formed to have different thicknesses within the first insulating layer 111. For example, a thickness of the first electrode part 180 may be smaller than a thickness of the second electrode part V1. Additionally, a width of the first electrode part 180 may be same as a width of the second electrode part V1. Accordingly, a width of the first concave portion 121-11 may be the same as a width of the second concave portion 122-11.

In summary, a total area of the first electrode part 180 may be smaller than a total area of the second electrode part V1.

Accordingly, a depth of the first concave portion 121-11 and a depth of the second concave portion 122-11 in the first embodiment may be different from each other. For example, a depth of the first concave portion 121-11 may be smaller than a depth of the second concave portion 122-11.

However, if the depth of the first concave portion 121-11 and the depth of the second concave portion 122-11 are different from each other, the overall warpage characteristics of the circuit board may be deteriorated. For example, a flatness of the circuit board may decrease depending on a difference in depths between the first concave portion 121-11 and the second concave portion 122-11, and this may cause reliability problems.

For example, a first-first connection part is disposed on the first pad, and a first-second connection part is disposed on the second pad. At this time, if a depth of the first concave portion 121-11 and a depth of the second concave portion 122-11 are different from each other, a height of the first-first connection part and a height of the first-second connection part may be different from each other. Accordingly, a chip mounted on the first-first connection part and the first-second connection part may be mounted tilted to one side due to the difference in heights of the connection parts. Accordingly, the embodiment solves this problem.

Referring to FIG. 3B, a circuit board of a second embodiment includes a first pad 121a and a second pad 122 disposed on the first insulating layer 111. Additionally, a first electrode part 180a is formed in the first insulating layer 111 and vertically overlaps the first pad 121a. Additionally, a second electrode part V1 is disposed in the first insulating layer 111 and vertically overlaps the second pad 122. The second electrode part V1 may electrically connect the second pad 122 and the second circuit pattern layer 130.

At this time, the circuit board of the second embodiment other than the first pad 121a and the first electrode part 180a is substantially the same as the circuit board of the first embodiment, and accordingly, only the first pad 121a and the first electrode part 180a will be described.

The first electrode part 180a may vertically overlap the first pad 121a. At this time, the first electrode part 180a may have a first width W1. Meanwhile, the second electrode part V1 may have a second width W2 that is different from the first width W1. For example, the first width W1 of the first electrode part 180a may be greater than the second width W2 of the second electrode part V1.

Specifically, a thickness of the first electrode part 180a is smaller than a thickness of the second electrode part V1.

Accordingly, in the first embodiment, the depth difference between the first concave portion and the second concave portion formed in the first pad and the second pad occurs due to the difference in size or area between the first electrode part and the second electrode part.

Accordingly, in the second embodiment, as a thickness of the first electrode part 180a is smaller than a thickness of the second electrode part V1, a first width W1 of the first electrode part 180a is set to be greater than a second width W2 of the second electrode part V1. For example, the first width W1 of the first electrode part 180a may satisfy a range of 120% to 180% of the second width W2 of the second electrode part V1. For example, the first width W1 of the first electrode part 180a may satisfy a range of 125% to 175% of the second width W2 of the second electrode part V1. For example, the first width W1 of the first electrode part 180a may satisfy a range of 130% to 170% of the second width W2 of the second electrode part V1. For example, the embodiment allows the first electrode part 180a and the second electrode part V1 to have a difference in width equal to the difference in thickness, and allows areas of the first electrode part 180a and the second electrode part V1 to be the same.

Accordingly, in the embodiment, a first concave portion 121-11a is formed on the first pad 121a, a second concave portion 122-11 is formed on the second pad 122, and depths of the first concave portion 121-11a and the second concave portion 122-11 may be the same.

Referring to FIG. 3C, a circuit board according to a third embodiment includes a first pad 121 and a second pad 122 disposed on the first insulating layer 111. Additionally, a first electrode part 180b is formed in the first insulating layer 111 and vertically overlaps the first pad 121. Additionally, a second electrode part V1 is disposed in the first insulating layer 111 and vertically overlaps the second pad 122. The second electrode part V1 may electrically connect the second pad 122 and the second circuit pattern layer 130.

Meanwhile, a lower surface 180bB of the first electrode part 180b may have a surface roughness different from that of a lower surface V1B of the second electrode part V1. For example, a surface roughness of the lower surface 180bB of the first electrode part 180b may be greater than a surface roughness of the lower surface V1B of the second electrode part V1.

Preferably, the second electrode part V1 is formed by filling a conductive material in a through hole passing through the first insulating layer 111. At this time, the through hole vertically overlaps the second circuit pattern layer 130, and accordingly, the second circuit pattern layer 130 can function as a laser stopper in a laser process of forming the through hole. Accordingly, the lower surface V1B of the second electrode part V1 may have a surface roughness corresponding to a surface roughness of an upper surface of the second circuit pattern layer 130.

Differently, the first electrode part 180b is formed by forming a groove that does not passes through the first insulating layer 111 and filling the inside of the formed groove with a conductive material. Accordingly, there is no laser stopper in a lower part of the groove. Through this, the surface roughness of the lower surface 180bB of the first electrode part 180b may correspond to a surface roughness of a bottom surface of the groove. At this time, the groove is formed by adjusting a laser intensity without a laser stopper, and accordingly, a bottom surface of the groove may have an uneven shape. For example, the bottom surface of the groove may be curved. For example, the bottom surface of the groove may have an egg plate shape including a convex surface and a concave surface corresponding to a beam size of the laser. Accordingly, the surface roughness of the lower surface 180bB of the first electrode part 180b may be greater than the surface roughness of the lower surface V1B of the second electrode part V1.

Referring to FIG. 3D, the first circuit pattern layer 120 of the embodiment may further include a third pad 124.

The third pad 124 may be either the first pad 121 or the second pad 122. For example, at least one of the first pad and the second pad described above may have a structure of a third pad described below.

Specifically, the first circuit pattern layer 120 may include a pad connected 1:1 with one terminal of the chip, or alternatively, the first circuit pattern layer 120 may include a pad commonly connected to two or more N terminals. And, the third pad 124 may refer to a pad commonly connected to the N terminals of the chip. For example, the third pad 124 may be a ground pad commonly connected to N terminals of the chip. For example, the third pad 124 may be a heat dissipation pad commonly connected to the N terminals of the chip.

Accordingly, an upper surface of the third pad 124 is divided into a plurality of regions, and connection parts such as solder balls can be formed in each of the divided regions.

Accordingly, the first electrode part 180 and the second electrode part V1 described above may be formed in a lower part of one third pad 124, respectively.

For example, an upper surface of the third pad 124 includes a first upper surface 124-1 and a second upper surface 124-2 on which connection parts such as solder balls are disposed.

At this time, at least a portion of the third pad 124 may vertically overlap the second electrode part V1. For example, the third pad 124 includes a second upper surface 124-2 on which the connection part is disposed while vertically overlapping the second electrode part V1. Additionally, a second concave portion 124-21 concave downward may be formed on the second upper surface 124-2 of the third pad 124.

Additionally, the third pad 124 may include a first upper surface 124-1 on which the connection part is disposed without vertically overlapping the second electrode part V1. Accordingly, in the embodiment, the first electrode part 180 is formed in the first insulating layer 111 that vertically overlaps the first upper surface 124-1. Accordingly, in the embodiment, a first concave portion 124-11 may be formed on the first upper surface 124-1 of the third pad 124.

The circuit board of the embodiment includes a first pad and a second pad disposed on an upper surface of a first insulating layer. Additionally, a first electrode part is disposed in the first insulating layer to vertically overlap the first pad, and a second electrode part is disposed in the first insulating layer to vertically overlap the second pad. The second electrode part is a via that electrically connects the second circuit pattern layer disposed on a lower surface of the first insulating layer and the second pad. In contrast, the first electrode part does not passes through the first insulating layer and therefore does not directly contact the second circuit pattern layer. For example, a lower surface of the first electrode part may be positioned higher than an upper surface of the second circuit pattern layer. That is, the first electrode part does not function to electrically connect the first pad and the second circuit pattern layer, and may be a dummy electrode for forming a first concave portion on the upper surface of the first pad. Accordingly, a first concave portion corresponding to the first electrode part is formed on the upper surface of the first pad of the embodiment.

Accordingly, the embodiment allows a first concave portion to be formed on the upper surface of the first pad, thereby preventing overflow of connection parts such as solder balls disposed on the first pad. In addition, the embodiment prevents overflow of the connection part, so that the connection part can be stably placed on the first pad, and this can improve the adhesion between the first pads of the connection part. Furthermore, the embodiment prevents the connection part from overflowing, so that it is possible to prevent the connection part from contacting a circuit pattern (e.g., a trace) adjacent to the first pad, and this can solve electrical reliability problems such as circuit shorts.

Additionally, a second concave portion corresponding to the second electrode part is formed on an upper surface of the second pad in the embodiment. At this time, a thickness of the first electrode part is smaller than a thickness of the second electrode part. Accordingly, when the first electrode part and the second electrode part have a same width, a depth of the first concave portion may be smaller than a depth of the second concave portion. At this time, a first-first connection part may be disposed on the first pad, and a first-second connection part may be disposed on the second pad. At this time, if the depth of the first concave portion and the depth of the second concave portion are different from each other, there may be a difference between the height of the first-first connection part and the height of the first-second connection part. In addition, if the height of the first-first connection part and the height of the first-second connection part are different from each other, the chip may be mounted in an inclined state on the first-first connection part and the first-second connection part, and this may cause reliability problems. Accordingly, the embodiment allows the width of the first electrode part to be greater than the width of the second electrode part, so that the depth of the first concave portion and the depth of the second concave portion are substantially the same. Accordingly, the embodiment allows the height of the first-first connection part and the height of the first-second connection part to have the same height, thereby improving mount characteristics of the chip.

FIG. 4 is a diagram showing a semiconductor package according to an embodiment.

Referring to FIG. 4, the semiconductor package of the embodiment may have a structure in which at least one chip is mounted on the circuit board of FIG. 2. At this time, the semiconductor package of FIG. 4 may include a circuit board having a structure shown in any one of FIGS. 3A to 3D.

For example, a package substrate may include a first connection part 210 disposed on the first pad 121 and the second pad 122 of the first circuit pattern layer 120 disposed on a first outermost side of the circuit board.

A first connection part 210 may have a spherical shape. For example, a cross section of the first connection part 210 may include a circular shape or a semicircular shape. For example, a cross section of the first connection part 210 may include a partially or entirely rounded shape. For example, a cross-sectional shape of the first connection part 210 may be flat on one side and curved on other side. The first connection part 210 may be a solder ball, but is not limited thereto.

At this time, the first connection part 210 may be formed by filling the first concave portion 121-11 of the first pad 121 and the second concave portion 122-11 of the second pad 122. Accordingly, the embodiment may allow the first connection part 210 to block the flow using the first concave portion 121-11 and the second concave portion 122-11, and this can solve electrical reliability problems such as circuit shorts.

The semiconductor package of the embodiment may include a chip 220 disposed on the first connection part 210. The chip 220 may be a processor chip. For example, the chip 220 may be an application processor (AP) chip of any one of a central processor (e.g., CPU), a graphics processor (e.g., GPU), a digital signal processor, a cryptographic processor, a microprocessor, and a microcontroller.

At this time, a terminal 225 may be provided on a lower surface of the chip 220, and the terminal 225 may be electrically connected to a pad 121 and 122 of the first circuit pattern layer 120 of the circuit board through the first connection part 210.

Meanwhile, the semiconductor package of the embodiment may have a plurality of chips arranged at a certain distance from each other on one circuit board. For example, the chip 220 may include a first chip and a second chip that are spaced apart from each other.

Also, the first chip and the second chip may be different types of application processor (AP) chips.

Meanwhile, the first chip and the second chip may be spaced apart from each other at a certain distance on the circuit board. For example, the distance between the first chip and the second chip may be 150 μm or less. For example, the distance between the first chip and the second chip may be 120 μm or less. For example, the distance between the first chip and the second chip may be 100 μm or less.

Preferably, for example, the distance between the first chip and the second chip may range from 60 μm to 150 μm. For example, the distance between the first chip and the second chip may range from 70 μm to 120 μm. For example, the distance between the first chip and the second chip may range from 80 μm to 110 μm. For example, if the distance between the first chip and the second chip is less than 60 μm, interference between the first chip and the second chip may cause problems with the operational reliability of the first chip or the second chip. For example, if the distance between the first chip and the second chip is greater than 150 μm, signal transmission loss may increase as the distance between the first chip and the second chip increases.

The semiconductor package may include a molding layer 230. The molding layer 230 may be disposed to cover the chip 220. For example, the molding layer 230 may be EMC (Epoxy Mold Compound) formed to protect the mounted chip 220, but is not limited thereto.

At this time, the molding layer 230 may have a low dielectric constant to increase heat dissipation characteristics. For example, the dielectric constant (Dk) of the molding layer 230 may be 0.2 to 10. For example, the dielectric constant (Dk) of the molding layer 230 may be 0.5 to 8. For example, the dielectric constant (Dk) of the molding layer 230 may be 0.8 to 5. Accordingly, the embodiment allows the molding layer 230 to have a low dielectric constant, thereby improving heat dissipation characteristics for heat generated from the chip 220.

Meanwhile, the semiconductor package may include a second connection part 240 disposed on a lowermost side of the circuit board. The second connection part 240 may be used for bonding between the semiconductor package and an external board (e.g., a main board of an external device).

Hereinafter, a method of manufacturing a circuit board according to an embodiment will be described.

FIGS. 5A to 5I are diagrams showing a method of manufacturing a circuit board according to an embodiment in order of processes.

Referring to FIG. 5A, the embodiment prepares a second insulating layer 112. The second insulating layer 112 may be a core layer. In addition, when the second insulating layer 112 is a core layer, the second insulating layer 112 may be CCL (Copper Clad Laminate). In addition, the embodiment may proceed with a process of forming a second via hole VH2 passing through the second insulating layer 112. At this time, the second insulating layer 112 is a core layer having a certain thickness or more, and accordingly, the process of forming the second via hole VH2 may include a first process of forming a first part of the second via hole VH2 on an upper side of the second insulating layer 112 and a second process of forming a second part connected to the first part of the second via hole VH2 on a lower side of the second insulating layer 112. Accordingly, the second via hole VH2 may have an hourglass shape based on the combination of the first part and the second part. Meanwhile, although not shown in FIG. 8A, copper foil layers (not shown) may be laminated on upper and lower surfaces of the second insulating layer 112, respectively.

Next, the embodiment may proceed with a process of forming a second via 170 filling the second via hole VH2 of the second insulating layer 112, a second circuit pattern layer 130 disposed on the upper surface of the second insulating layer 112, and a third circuit pattern layer 140 disposed on the lower surface of the second insulating layer 112.

For this purpose, as shown in FIG. 5B, the embodiment forms a dry film DF with an opening exposing the region where the second circuit pattern layer 130 and the third circuit pattern layer 140 will be formed on the upper and lower surfaces of the second insulating layer 112.

In addition, as shown in FIG. 5O, the embodiment may proceed with a process of forming the second via V2, the second circuit pattern layer 130, and the third circuit pattern layer 140 by performing plating to fill the second via hole VH2 and the opening of the dry film DF1. At this time, in the embodiment, electroless plating is performed on the second insulating layer 112 or the copper foil layer (not shown) to form a chemical copper plating layer (not shown), and the plating may be performed using the chemical copper plating layer as a seed layer.

Next, as shown in FIG. 5D, the embodiment may proceed with a process of laminating the first insulating layer 111 on the first or upper surface of the second insulating layer 112 and a process of laminating the third insulating layer 113 on the second or lower surface of the second insulating layer 112.

At this time, the first insulating layer 111 and the third insulating layer 113 may be prepreg or, alternatively, may be RCC.

Also, although it is not shown in the drawing, a copper foil layer (not shown) may be formed on each of the first surface of the first insulating layer 111 and the second surface of the third insulating layer 113.

Next, as shown in FIG. 5E, the embodiment may proceed with a process of forming a through hole VH1 and a non-through groove 180R in the first insulating layer 111 and a process of forming a through hole VH3 in the third insulating layer 113.

The through hole VH1 of the first insulating layer 111 may be formed in a region where the second electrode part V1 corresponding to the first via will be disposed, and the through hole VH3 of the third insulating layer 113 may be formed in a region where the third via V3 will be disposed.

Additionally, the non-through groove 180R in the first insulating layer 111 may be formed in a region where the first electrode part 180 will be disposed. At this time, the through hole VH1 and the non-through groove 180R may be formed by performing separate laser processes. Alternatively, the through hole VH1 and the non-through groove 180R may each be formed in the first insulating layer 111 through a change in laser intensity in one laser process.

Next, as shown in FIG. 5F, the embodiment may proceed with a process of forming the first circuit pattern layer 120 disposed on the first insulating layer 111 while forming a first electrode part 180 and a second electrode part V1 in the first insulating layer 111. Additionally, the embodiment may proceed with a process of forming a fourth circuit pattern layer on the lower surface of the third insulating layer 113 while forming a third via V3 in the third insulating layer 113.

Next, as shown in FIG. 10F, the embodiment may proceed with a process of forming a first protective layer 160 on the upper surface of the first insulating layer 111 and a process of forming a second protective layer 170 on the lower surface of the third insulating layer 113. At this time, the first protective layer 160 and the second protective layer 170 may be formed entirely on an upper part of the first insulating layer 111 and a lower part of the third insulating layer 113.

Next, as shown in FIG. 10H, the embodiment may proceed with a process of exposing and curing regions of the first protective layer 160 and the second protective layer 170, excluding the region where the opening will be formed.

In addition, as shown in FIG. 10I, the embodiment may proceed with a process of forming an opening by developing a region that has not been exposed and cured.

At this time, the embodiment may proceed with a process of reducing a thickness of the protective layer in a corresponding region by thinning the uncured region to form the opening. At this time, the thinning can be performed using an organic alkaline compound containing tetramethylammonium hydroxide (TMAH) or trimethyl-2-hydroxyethylammonium hydroxide (choline) for the unexposed region.

The circuit board of the embodiment includes a first pad and a second pad disposed on an upper surface of a first insulating layer. Additionally, a first electrode part is disposed in the first insulating layer to vertically overlap the first pad, and a second electrode part is disposed in the first insulating layer to vertically overlap the second pad. The second electrode part is a via that electrically connects the second circuit pattern layer disposed on a lower surface of the first insulating layer and the second pad. In contrast, the first electrode part does not passes through the first insulating layer and therefore does not directly contact the second circuit pattern layer. For example, a lower surface of the first electrode part may be positioned higher than an upper surface of the second circuit pattern layer. That is, the first electrode part does not function to electrically connect the first pad and the second circuit pattern layer, and may be a dummy electrode for forming a first concave portion on the upper surface of the first pad. Accordingly, a first concave portion corresponding to the first electrode part is formed on the upper surface of the first pad of the embodiment. Accordingly, the embodiment allows a first concave portion to be formed on the upper surface of the first pad, thereby preventing overflow of connection parts such as solder balls disposed on the first pad. In addition, the embodiment prevents overflow of the connection part, so that the connection part can be stably placed on the first pad, and this can improve the adhesion between the first pads of the connection part. Furthermore, the embodiment prevents the connection part from overflowing, so that it is possible to prevent the connection part from contacting a circuit pattern (e.g., a trace) adjacent to the first pad, and this can solve electrical reliability problems such as circuit shorts.

Additionally, a second concave portion corresponding to the second electrode part is formed on an upper surface of the second pad in the embodiment. At this time, a thickness of the first electrode part is smaller than a thickness of the second electrode part. Accordingly, when the first electrode part and the second electrode part have a same width, a depth of the first concave portion may be smaller than a depth of the second concave portion. At this time, a first-first connection part may be disposed on the first pad, and a first-second connection part may be disposed on the second pad. At this time, if the depth of the first concave portion and the depth of the second concave portion are different from each other, there may be a difference between the height of the first-first connection part and the height of the first-second connection part. In addition, if the height of the first-first connection part and the height of the first-second connection part are different from each other, the chip may be mounted in an inclined state on the first-first connection part and the first-second connection part, and this may cause reliability problems. Accordingly, the embodiment allows the width of the first electrode part to be greater than the width of the second electrode part, so that the depth of the first concave portion and the depth of the second concave portion are substantially the same. Accordingly, the embodiment allows the height of the first-first connection part and the height of the first-second connection part to have the same height, thereby improving mount characteristics of the chip.

On the other hand, when the circuit board having the above-described characteristics of the invention is used in an IT device or home appliance such as a smart phone, a server computer, a TV, and the like, functions such as signal transmission or power supply can be stably performed. For example, when the circuit board having the features of the present invention performs a semiconductor package function, it can function to safely protect the semiconductor chip from external moisture or contaminants, or alternatively, it is possible to solve problems of leakage current, electrical short circuit between terminals, and electrical opening of terminals supplied to the semiconductor chip. In addition, when the function of signal transmission is in charge, it is possible to solve the noise problem. Through this, the circuit board having the above-described characteristics of the invention can maintain the stable function of the IT device or home appliance, so that the entire product and the circuit board to which the present invention is applied can achieve functional unity or technical interlocking with each other.

When the circuit board having the characteristics of the invention described above is used in a transport device such as a vehicle, it is possible to solve the problem of distortion of a signal transmitted to the transport device, or alternatively, the safety of the transport device can be further improved by safely protecting the semiconductor chip that controls the transport device from the outside and solving the problem of leakage current or electrical short between terminals or the electrical opening of the terminal supplied to the semiconductor chip. Accordingly, the transportation device and the circuit board to which the present invention is applied can achieve functional integrity or technical interlocking with each other. Furthermore, when the circuit board having the above-described characteristics of the invention is used in a transportation device such as a vehicle, it is possible to transmit a high-current signal required by the vehicle at a high speed, thereby improving the safety of the transportation device. Furthermore, the circuit board and the semiconductor package including the same can be operated normally even in an unexpected situation occurring in various driving environments of the transportation device, thereby safely protecting the driver.

The characteristics, structures and effects described in the embodiments above are included in at least one embodiment but are not limited to one embodiment. Furthermore, the characteristics, structures, and effects and the like illustrated in each of the embodiments may be combined or modified even with respect to other embodiments by those of ordinary skill in the art to which the embodiments pertain. Thus, it should be construed that contents related to such a combination and such a modification are included in the scope of the embodiment.

The above description has been focused on the embodiment, but it is merely illustrative and does not limit the embodiment. A person skilled in the art to which the embodiment pertains may appreciate that various modifications and applications not illustrated above are possible without departing from the essential features of the embodiment. For example, each component particularly represented in the embodiment may be modified and implemented. In addition, it should be construed that differences related to such changes and applications are included in the scope of the embodiment defined in the appended claims.

The invention claimed is:

1. A circuit board, comprising:
   a first insulating layer;
   a first circuit pattern layer disposed on the first insulating layer and including a first pad;
   a second circuit pattern layer disposed on a lower surface of the first insulating layer; and
   a first electrode part disposed in the first insulating layer and vertically overlapping the first pad, wherein a lower surface of the first electrode part is located higher than an upper surface of the second circuit pattern layer, wherein the first pad includes a first concave portion formed in an upper surface of the first pad in a region that vertically overlaps the first electrode part, wherein an upper surface of the first electrode part is in direct contact with a lower surface of the first pad, and wherein the lower surface of the first electrode part is spaced apart in a vertical direction from the upper surface of the second circuit pattern layer.

2. The circuit board of claim 1, wherein a thickness of the first electrode part satisfies a range of 20% to 80% of a thickness of the first insulating layer, and wherein the thickness of the first insulating layer is a vertical distance between a lower surface of the first circuit pattern layer and the upper surface of the second circuit pattern layer.

3. The circuit board of claim 1, wherein the first pad includes a first-first portion that vertically overlaps the first electrode part, and a first-second portion that does not vertically overlap the first electrode part, and wherein the first concave portion is provided at the first-first portion of the first pad.

4. The circuit board of claim 3, wherein an upper surface of the first-second portion of the first pad includes a curved surface whose height decreases as it moves away from the first-first portion.

5. The circuit board of claim 1, wherein the first circuit pattern layer includes a second pad spaced apart from the first pad in a horizontal direction, wherein a second electrode part is provided to pass through the first insulating layer vertically overlapping the second pad, wherein an upper surface of the second electrode part is in direct contact with a lower surface of the second pad, and wherein a lower surface of the second electrode part is in direct contact with the second circuit pattern layer.

6. The circuit board of claim 5, wherein the second pad includes a second concave portion formed in a region that vertically overlaps the second electrode part.

7. The circuit board of claim 6, wherein a width of the first electrode part corresponds to a width of the second electrode part, and wherein a depth of the first concave portion is smaller than a depth of the second concave portion.

8. The circuit board of claim 6, wherein a width of the first electrode part is greater than a width of the second electrode part, and wherein a depth of the first concave portion corresponds to a depth of the second concave portion.

9. The circuit board of claim 8, wherein the width of the first electrode part satisfies a range of 120% to 180% of the width of the second electrode part.

10. The circuit board of claim 5, wherein a surface roughness of the lower surface of the first electrode part is greater than a surface roughness of the lower surface of the second electrode part.

11. The circuit board of claim 5, wherein the lower surface of the first electrode part includes at least one of a first curved surface convex toward the first circuit pattern layer and a second curved surface convex toward the second circuit pattern layer.

12. The circuit board of claim 1, further comprising:
a second electrode part passing through the first insulating layer, wherein an upper surface of the second electrode part is in direct contact with the first pad and a lower surface of the second electrode part is in direct contact with the upper surface of the second circuit pattern layer, wherein the first pad includes a first region vertically overlapping with the first electrode part and a second region that vertically overlaps the second electrode part, and wherein the first concave portion is formed on an upper surface of the first region of the first pad, and the first pad includes a second concave portion formed on an upper surface of the second region.

13. The circuit board of claim 1, further comprising:
a first protective layer disposed on an upper surface of the first insulating layer, wherein the first protective layer includes a first portion having a height lower than a height of the first pad and disposed surrounding a side surface of the first pad.

14. The circuit board of claim 1, wherein the first electrode part has an inclination where a width in a horizontal direction decreases along a vertical direction.

15. The circuit board of claim 14, wherein the second electrode part has an inclination inclined in a same direction as a direction of the inclination of the first electrode portion.

16. A semiconductor package, comprising:
a first insulating layer;
a first circuit pattern layer including a first pad and a second pad disposed on the first insulating layer;
a second circuit pattern layer disposed on a lower surface of the first insulating layer;
a first electrode part disposed in the first insulating layer and vertically overlapping the first pad;
a second electrode part disposed in the first insulating layer and vertically overlapping the second pad;
a first connection part disposed on the first pad and the second pad;
a chip mounted on the first connection part; and
a molding layer for molding the chip, wherein the first electrode part has a thickness less than a thickness of the first insulating layer, wherein the second electrode part has a thickness corresponding to the thickness of the first insulating layer, wherein the first pad includes a first concave portion formed in an upper surface of the first pad in a region that vertically overlaps the first electrode part, wherein the second pad includes a second concave portion formed in a region that vertically overlaps the second electrode part, wherein an upper surface of the first electrode part is in direct contact with a lower surface of the first pad, and wherein the lower surface of the first electrode part is spaced apart in a vertical direction from the upper surface of the second circuit pattern layer.

17. The semiconductor package of claim 16, wherein the first connection part includes a first-first connection part disposed on the first pad and filling the first concave portion; and a first-second connection part disposed on the second pad and filling the second concave portion.

18. The semiconductor package of claim 16, wherein the chip includes a first chip and a second chip that are spaced apart from each other in a width direction or arranged in a vertical direction on the first insulating layer.

\* \* \* \* \*